United States Patent
Wintermantel

(10) Patent No.: US 7,444,365 B2
(45) Date of Patent: Oct. 28, 2008

(54) NON-LINEAR DIGITAL RANK FILTERING OF INPUT SIGNAL VALUES

(75) Inventor: Markus Wintermantel, Lindau (DE)

(73) Assignee: A.D.C. Automotive Distance Control Systems GmbH, Lindau (DE)

( * ) Notice: Subject to any disclaimer, the term of this patent is extended or adjusted under 35 U.S.C. 154(b) by 678 days.

(21) Appl. No.: 11/018,865

(22) Filed: Dec. 20, 2004

(65) Prior Publication Data

US 2005/0138096 A1    Jun. 23, 2005

Related U.S. Application Data

(63) Continuation of application No. PCT/DE03/02050, filed on Jun. 18, 2003.

(30) Foreign Application Priority Data

Jun. 18, 2002    (DE)    ................................ 102 50 607

(51) Int. Cl.
 *G06F 17/10*    (2006.01)
(52) U.S. Cl. ...................................... 708/304
(58) Field of Classification Search .................. 708/304
See application file for complete search history.

(56) References Cited

U.S. PATENT DOCUMENTS

| | | |
|---|---|---|
| 3,293,552 A | 12/1966 | Sichak et al. |
| 3,324,251 A | 6/1967 | Sichak et al. |
| 3,324,397 A | 6/1967 | Harvey |
| 3,662,386 A | 5/1972 | Bryant |

(Continued)

FOREIGN PATENT DOCUMENTS

EP    1 091 483    4/2001

(Continued)

OTHER PUBLICATIONS

U.S. Appl. No. 11/018,813, filed Dec. 2004, Wintermantel.

(Continued)

*Primary Examiner*—David H Malzahn
(74) *Attorney, Agent, or Firm*—W. F. Fasse; W. G. Fasse

(57) ABSTRACT

Input values are non-linearly digitally filtered to produce as an output value the $R^{th}$-largest value among the K input values, wherein the $R^{th}$-largest value may be the median value with $R=(K+1)/2$. The input values are provided in any binary fixed point number representation. A respective selected bit of all the input values is evaluated to determine the $R^{th}$-largest bit value of this bit among the K input values, and this gives the value of the corresponding bit of the output value. In the input values of which the selected bit does not correspond to the determined $R^{th}$-largest bit value, all of the subsequent less-significant bits are set as dummy bits equal to the selected bit, which excludes these input values from being the $R^{th}$-largest value in the subsequent evaluation of the successive less-significant bits. Then these steps are repeated for the next selected less-significant bit, and so forth, thereby respectively determining the successive bits of the output value. Minor modifications are necessary depending on the particular numerical representation. The method can be used for implementing digital filters, in particular for signal processing in systems for object recognition.

21 Claims, 12 Drawing Sheets

U.S. PATENT DOCUMENTS

| | | | |
|---|---|---|---|
| 3,702,476 A | 11/1972 | Nathanson et al. | |
| 3,713,153 A | 1/1973 | van Popta | |
| 4,049,953 A | 9/1977 | Evans, Jr. | |
| 4,072,949 A | 2/1978 | Van Brunt | |
| 4,214,242 A | 7/1980 | Colin | |
| 4,323,897 A | 4/1982 | Creighton et al. | |
| 4,513,440 A * | 4/1985 | Delman | 382/262 |
| 4,672,567 A | 6/1987 | Kelly et al. | |
| 4,717,917 A | 1/1988 | Alitz | |
| 4,723,553 A | 2/1988 | Miwa et al. | |
| 4,875,050 A | 10/1989 | Rathi | |
| 4,963,036 A | 10/1990 | Drisko et al. | |
| 5,138,567 A * | 8/1992 | Mehrgardt | 708/304 |
| 5,347,283 A | 9/1994 | Krizek et al. | |
| 5,534,867 A | 7/1996 | Rose | |
| 5,983,082 A | 11/1999 | Hilbert | |
| 6,369,633 B1 | 4/2002 | Tsukahara | |
| 6,462,705 B1 | 10/2002 | McEwan | |
| 7,010,287 B2 | 3/2006 | Oh et al. | |
| 7,072,921 B2 * | 7/2006 | Kim | 708/207 |
| 7,072,928 B2 * | 7/2006 | Kim | 708/304 |
| 7,260,593 B2 * | 8/2007 | Kim | 708/304 |
| 2001/0034749 A1 * | 10/2001 | Jiang | 708/202 |
| 2002/0063606 A1 | 5/2002 | van Seijl | |
| 2005/0156659 A1 | 7/2005 | Wintermantel | |
| 2006/0036353 A1 | 2/2006 | Wintermantel | |

FOREIGN PATENT DOCUMENTS

| | | |
|---|---|---|
| FR | 2 556 104 | 6/1985 |
| GB | 1023960 | 3/1966 |
| WO | 98/19177 | 5/1998 |

OTHER PUBLICATIONS

C. L. Lee et al., "Bit-Sliced Median Filter Design Based on Majority Gate" IEE Proceedings G. Electronic Circuits & Systems, Institution of Electrical Engineers. Stevenage, GB, vol. 139, No. 1, Feb. 1992, pp. 63-71, XP000293218 ISSN: 0622-0039.

E. Ataman et al.: "A fast method for real-time median filtering" IEEE Transactions on Acoustics, Speech and Signal Processing, vol. 28, No. 4, Aug. 1980, pp. 415-421, XP001160948 New York US.

* cited by examiner

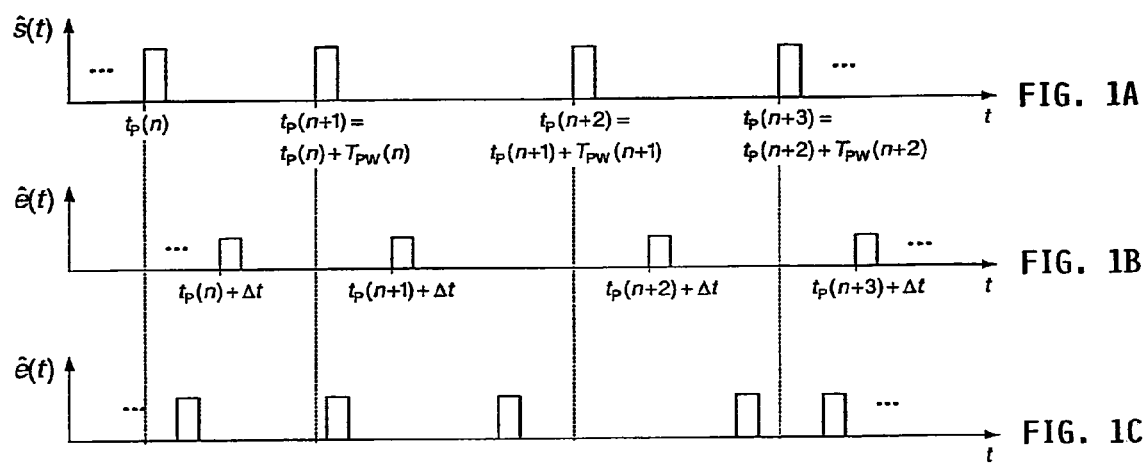

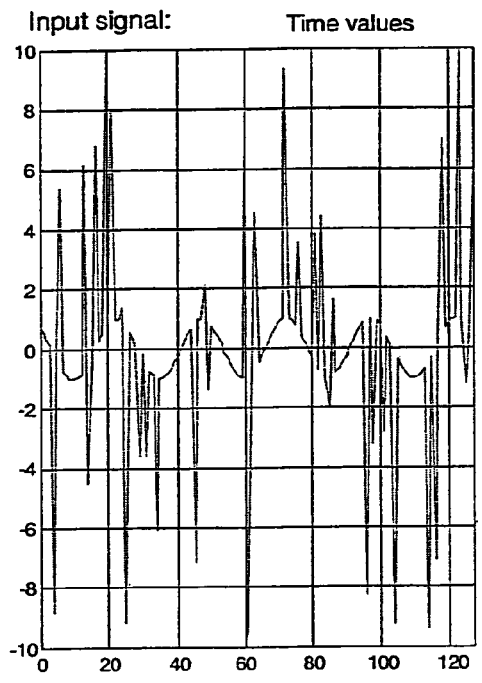
FIG. 2A1
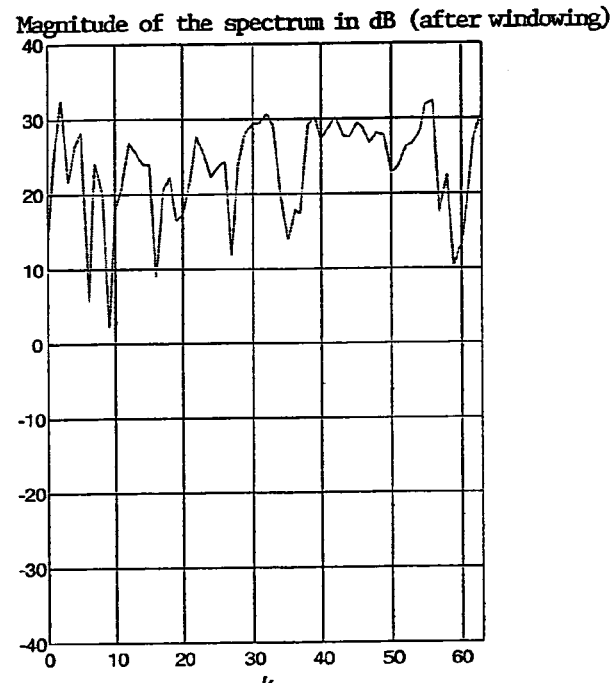
FIG. 2A2
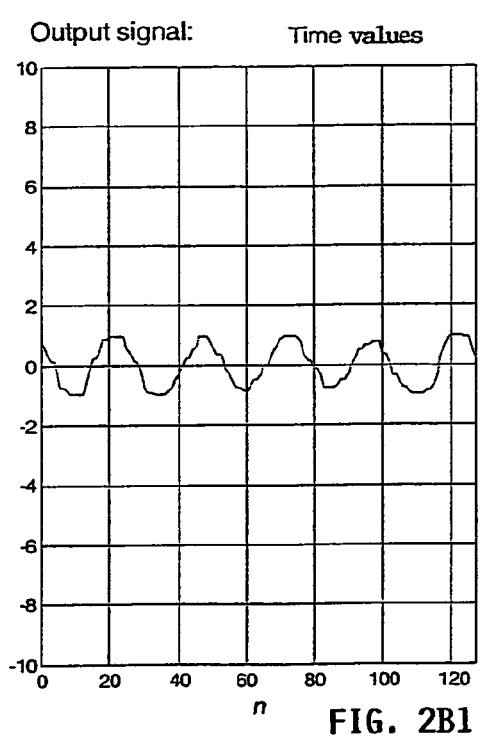
FIG. 2B1
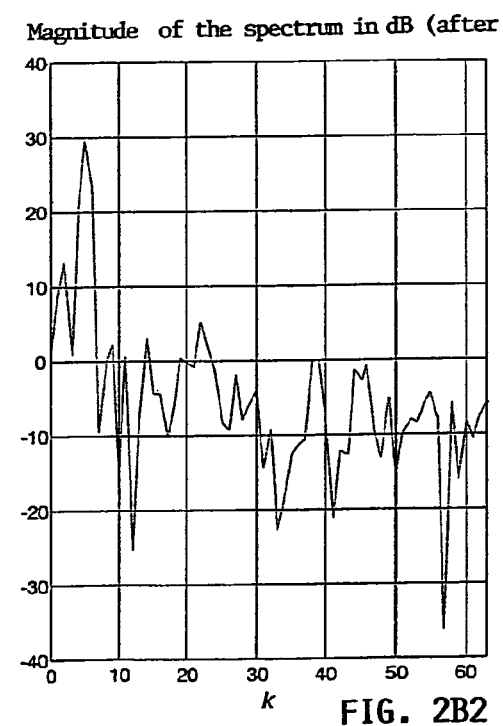
FIG. 2B2

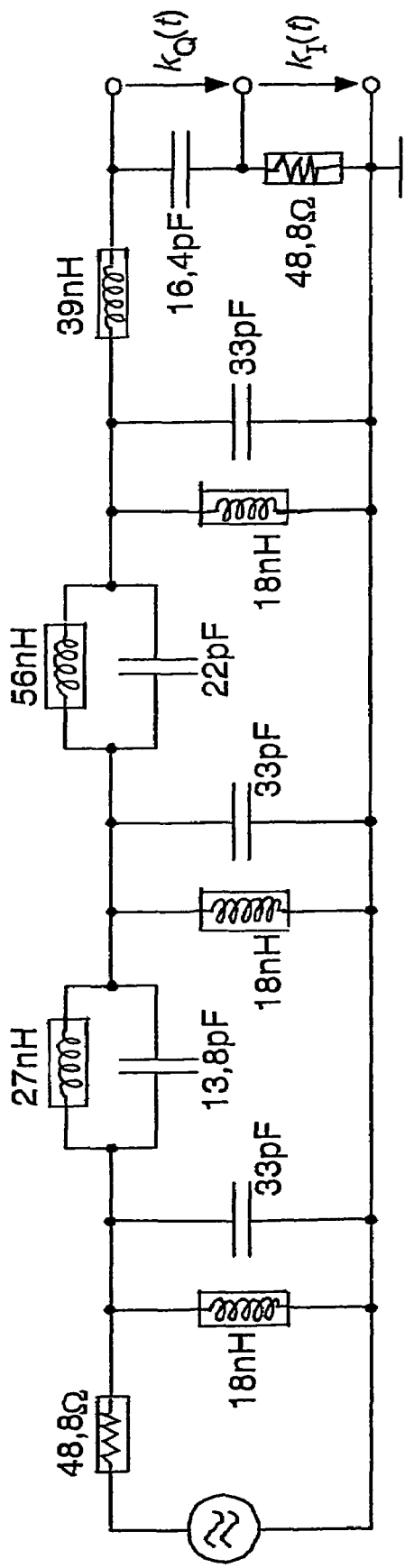
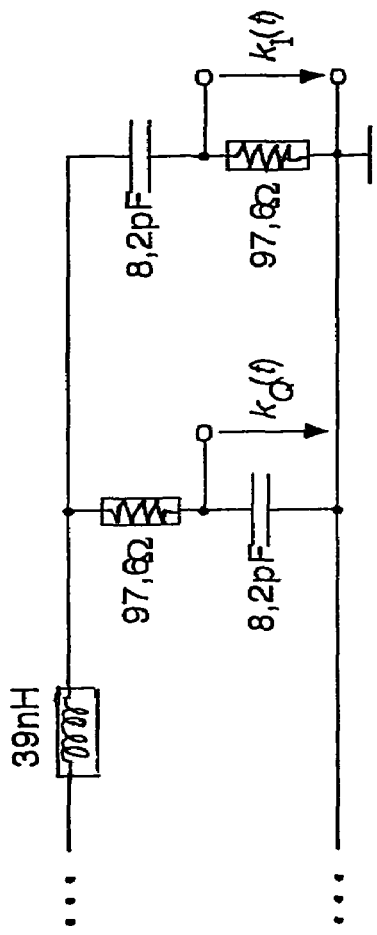
Fig. 7
Fig. 8

Fig. 9A
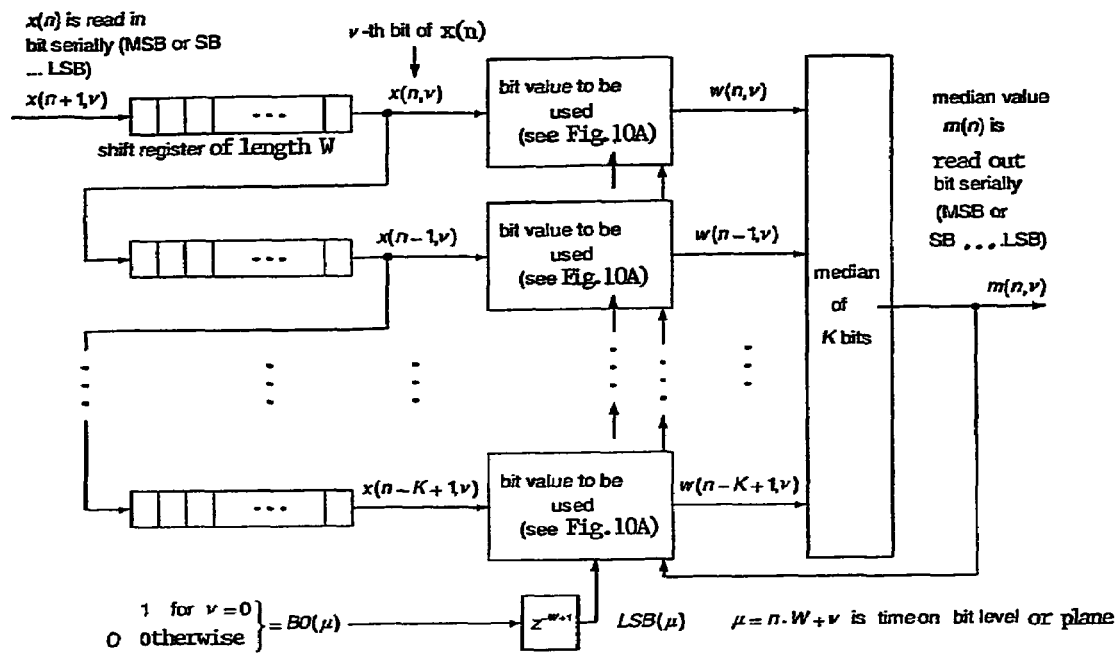
blocks "bit value to be used" in Fig. 9A:
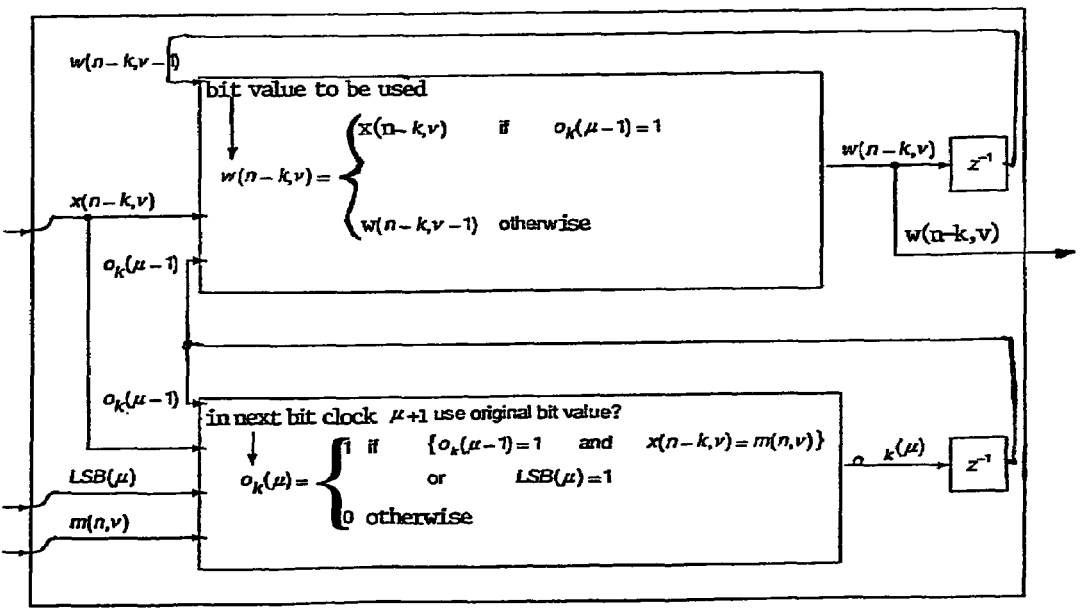
Fig. 10A

Fig.9B
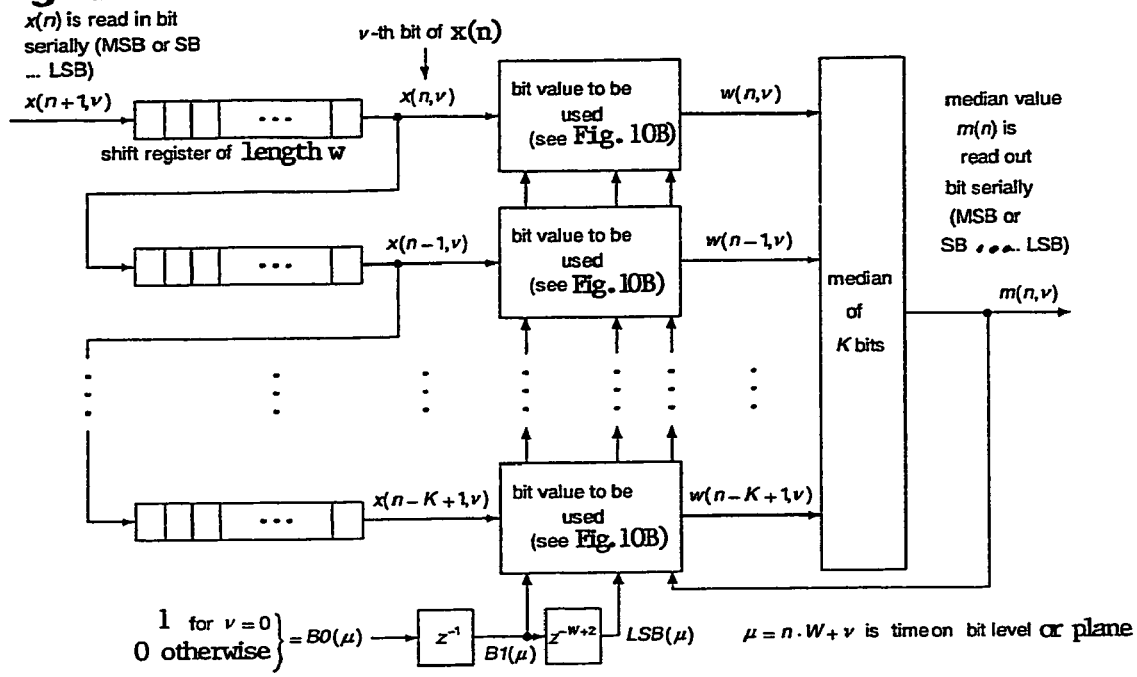
blocks "bit value to be used" in Fig. 9B:
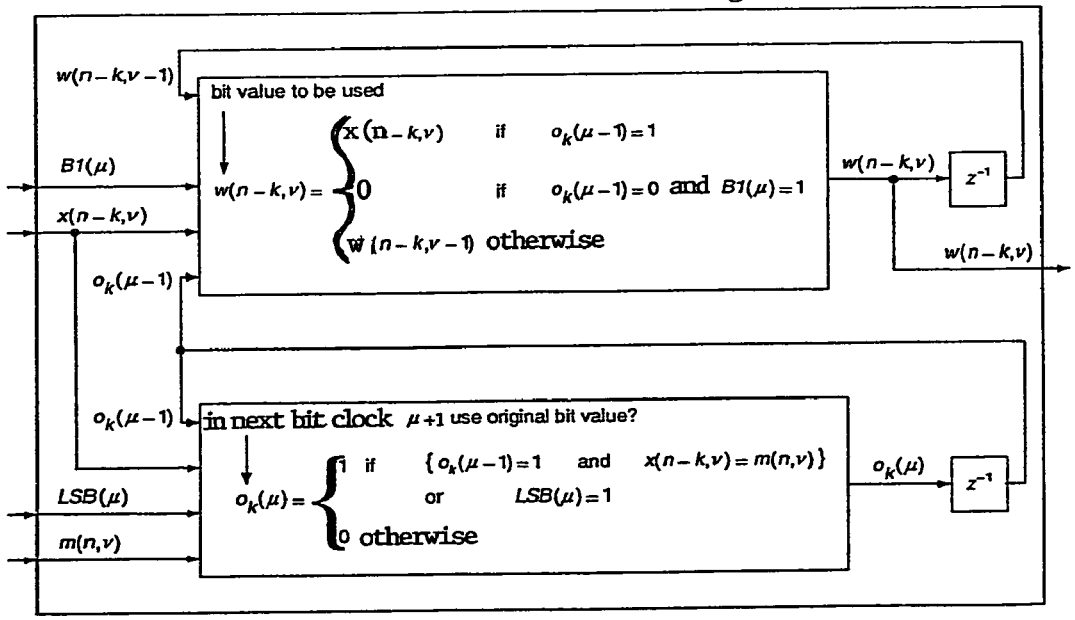
Fig.10B

NON-LINEAR DIGITAL RANK FILTERING OF INPUT SIGNAL VALUES

CROSS-REFERENCE TO RELATED APPLICATIONS

This application is a Continuation under 35 U.S.C. §111, 120 and §365 of PCT International Application PCT/DE03/02050, filed on Jun. 18, 2003, which designated the United States, and which was published in a language other than English. The entire disclosure of the PCT International Application is incorporated herein by reference. Also, this application is related to U.S. patent applications Ser. Nos. 11/018,813 and 11/018,844, both filed on Dec. 20, 2004.

PRIORITY CLAIM

Through the above PCT International Application, this application claims the foreign priority under 35 U.S.C. §119 of German Patent Application 102 50 607.8, filed on Jun. 18, 2002. The entire disclosure of the German Priority Application is incorporated herein by reference.

FIELD OF THE INVENTION

The invention relates to a method and apparatus for the non-linear digital filtering of K digital input values, which in general are adjacent or successive values of a one- or multi-dimensional digital signal, wherein the filtering determines the $R^{th}$-greatest value among the K input values as an output value, R and K being integers and $K \geq R \geq 1$.

BACKGROUND INFORMATION

A filter of the abovementioned general type shall be referred to hereinafter as a rank filter, wherein R=1 corresponds to the maximum (or greatest or largest) of the input values and R=K corresponds to the minimum (or smallest) of the input values. A one-dimensional rank filter computes at each moment $m = L \cdot n$ the R-maximum (i.e. $R^{th}$-greatest or $R^{th}$-largest) value of K consecutive values of an input signal x(n); for L=1 it is a filter without decimation, i.e. without any reduction of the sampling rate, for L>1 this is a filter with decimation. Analogously, a multidimensional rank filter detects the $R^{th}$-largest value of K adjacent values of a multi-dimensional signal. It goes without saying that here the $R^{th}$-largest input value corresponds to the (K−R)-minimum (i.e. $(K-R)^{th}$-smallest) input value, so that synonymously the method also comprises the determination of an x-minimum (i.e. $x^{th}$-smallest) input value, in which the $R^{th}$-largest value is searched for simply with R=K−x.

A special case of such a rank filter is a median filter. The median of an odd number K of input values is middle value among the several values, i.e. the (K+1)/2-smallest value or, equivalently, the (K+1)/2-largest value, which in general is different from the mean or average value. For instance, for the five values 5, 3, 2, 79 and 1, the median is the value 3, while the mean or average of these numbers is 18.

Digital filters of this type serve for signal processing of acquired input values, for example, the processing of image data or distance measuring signals, in particular also reflection signals of pulses reflected in a target area, whereby optical waves, preferably in the infrared region, radar waves or ultrasonic waves can be used. Implementing such a non-linear filter is only possible in the digital range.

For implementing such filters algorithms are known, which most often are based on sorting methods, which require extensive calculation or they are based on histogram methods, which require high storage requirements, and which are in general more suitable for software than hardware implementation.

SUMMARY OF THE INVENTION

It is an object of the invention to provide a new method for digital rank filtering, which can be implemented in a simple and cost-efficient manner. The invention further aims to avoid or overcome the disadvantages of the prior art, and to achieve additional advantages as apparent from the present specification. The attainment of these objects is, however, not a required limitation of the claimed invention.

The above objects have been achieved according to the invention in a method of non-linearly digitally filtering K input values to produce an output value corresponding to an $R^{th}$ greatest value among the K input values with $K \geq R \geq 1$, comprising the steps:

a) providing the K input values, each respectively in a binary fixed-point numerical representation having plural numerical bits in order of a respective bit significance thereof from a most-significant bit to a least-significant bit in succession, wherein each one of the numerical bits has a bit value of only 0 or 1, the bit significance diminishes by a factor of ½ from each one of the numerical bits to a next one of the numerical bits in succession from the most-significant bit to the least-significant bit, and the numerical representation may further optionally include a sign bit;

b) if the numerical representation does not include the sign bit then skipping the remainder of this step b), otherwise if the numerical representation includes the sign bit then evaluating the sign bits of the K input values as follows:

b1) if all of the input values are non-negative values or all of the input values are non-positive values then skipping the remainder of this step b);

b2) if there are at least R non-negative values and at least one negative value among the K input values then setting an output sign indicator as non-negative and setting all of the numerical bits of all of the at least one negative value to 0;

b3) if there are fewer than R but at least one non-negative value among the K input values then setting an output sign indicator as negative and setting all of the numerical bits of all of the at least one non-negative value to 0;

c) after the step b), selecting a respective current selected bit among the numerical bits of each of the K input values beginning with the most-significant bit and progressing successively with the bit significance diminishing toward the least-significant bit;

d) after the step c), determining a respective output bit of the output value for the respective current selected bit of the K input values as follows:

d1) if the numerical representation does not include the sign bit or if at least R of the K input values are non-negative values, then setting the respective output bit to 1 if the bit value 1 occurs at least R times as the current selected bit among the K input values and otherwise setting the respective output bit to 0; or d2) if fewer than R of the K input values are non-negative values, then setting the respective output bit to 0 if the bit value 0 occurs at least R times as the current selected bit among the K input values and otherwise setting the respective output bit to 1;

e) after the step d), revising the numerical bits following the respective current selected bit of the K input values, to the extent necessary as follows, by setting any and all of the numerical bits following the respective current selected bit to be equal to the respective current selected bit respectively in any and all of the input values of which the respective current selected bit does not correspond to the respective output bit;

f) repeating the steps c), d) and e) successively with successive ones of the respective current selected bit with the bit significance thereof successively diminishing in successive cycles of the steps c), d) and e), until all of the output bits of the output value have been or can be determined; and g) outputting the output sign indicator to indicate a sign of the $R^{th}$ greatest value and outputting the output value as a value of the $R^{th}$ greatest value.

The basic idea of the invention is to use a binary representation of the input values in fixed point format on the one hand and a bit serial processing on the other hand, whereby all usual binary number representations in fixed point format can be used, and merely minor adaptations are necessary while taking into account the respective attributes of the number representation that is being used. One or more independent claims define the general invention suitable for any number representation, while respective dependent claims define the particular adaptations as necessary for respective particular number representations.

In addition, the invention provides advantageous further embodiments for converting the digital filter in terms of the hardware into an FPGA or an ASIC, which allow high processing speed, as it is necessary for image processing or radar applications in motor vehicles.

BRIEF DESCRIPTION OF THE DRAWINGS

Hereinafter the invention will become apparent from the following description of example embodiments taken in conjunction with the drawings.

FIG. 1A shows an amplitude or envelope ŝ(t) of the transmitted wave for the case of rectangular pulses;

FIG. 1B shows an amplitude or envelope ê(t) of the received wave for the case of an object at the distance a, which results in a signal running or transit time of Δt=2a/c;

FIG. 1C shows a received signal ê(t) disturbed by interference for example due to trappings or interferences from another pulsed system working in the same frequency range;

FIG. 2A1 shows a sinusoidal oscillation of the input signal with numerous high interfering pulses superimposed thereon in the discrete time domain; and FIG. 2A2 shows the spectrum of the resulting signal, in which the spectral peak of the sinusoidal oscillation has disappeared in the noise produced by the interfering pulses;

FIG. 2B1 shows an output signal after a two-stage median filtering with a respective filter length of K=5, in which the sinusoidal oscillation in the time domain is nearly completely reconstructed, and is thus clearly visible in the spectrum shown in FIG. 2B2;

FIG. 7 is a circuit diagram of a first example embodiment of an optimum filter;

FIG. 8 is a circuit diagram of a second, preferred example embodiment of an optimum filter;

FIG. 9A shows an algorithm for implementing a median filter with a bit serial processing for binary data in a sign-less binary representation;

FIG. 9B shows an algorithm for implementing a median filter with a bit serial processing for binary data in a sign-value or sign-magnitude representation;

FIGS. 10A, 10B and 10C respectively show details of the block determining the bit value to be used for FIGS. 9A, 9B and 9C;

Figure 3:
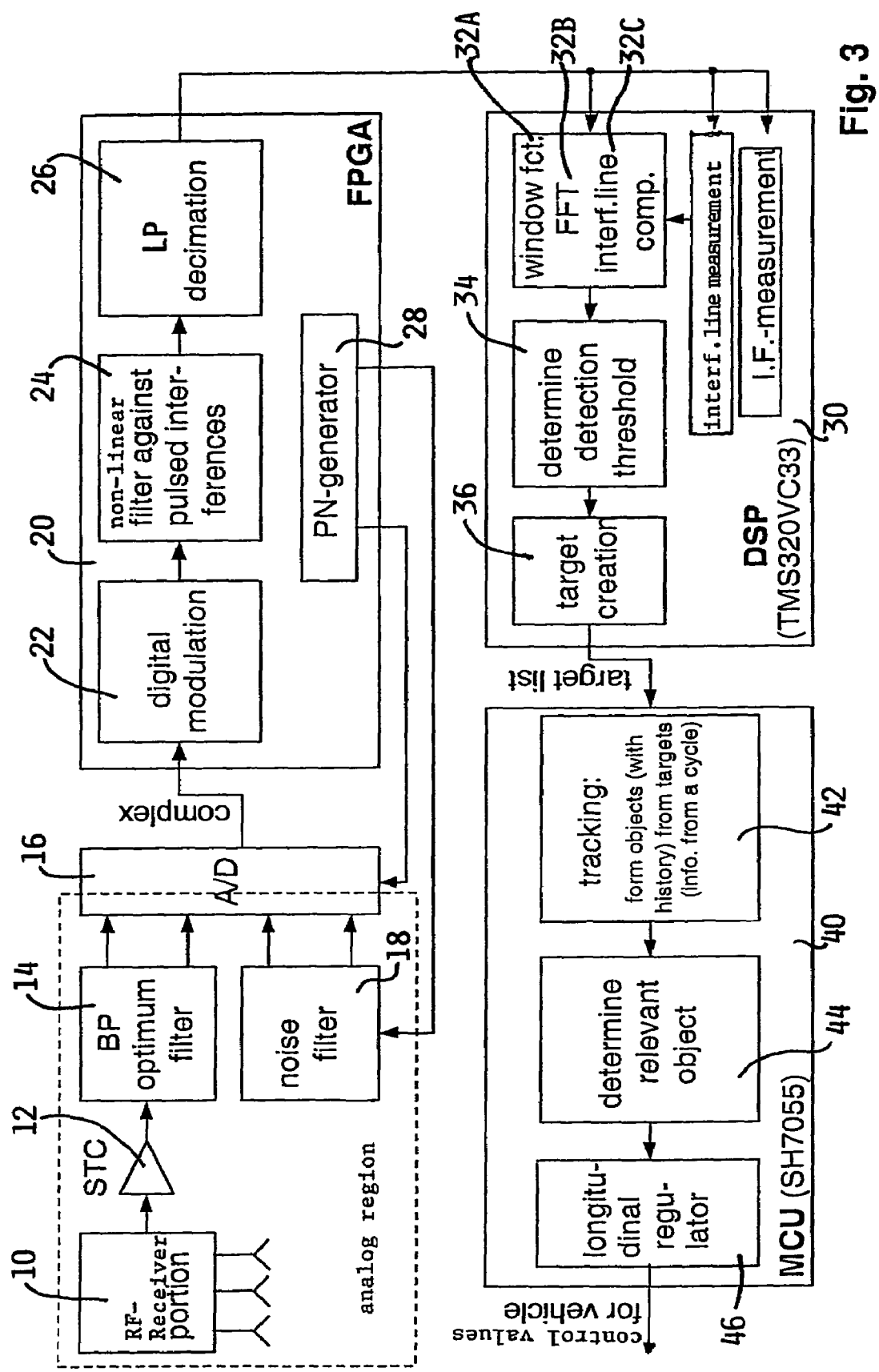
FIG. 3 is a block circuit diagram of a pulse modulated Doppler radar system.

DETAILED DESCRIPTION OF PREFERRED EXAMPLE EMBODIMENTS AND OF THE BEST MODE OF THE INVENTION

At first the inventive method for digital filtering shall be explained based on a simple example of determining the median of input values, as a special case of finding the $R^{th}$-largest value among the 5 values, where R is 3. For this purpose the following five numbers shall be examined in binary representation with no sign and with the word length of W=4 (4 binary digits); here the bit 0 refers to the most significant bit MSB and the bit 3 to the least significant bit LSB, as shown in the following table:

| Number | Bit | | | |
|---|---|---|---|---|
| | 0 | 1 | 2 | 3 |
| a | 1 | 1 | 0 | 1 |
| b | 1 | 0 | 1 | 0 |
| c | 1 | 1 | 1 | 1 |
| d | 0 | 0 | 1 | 0 |
| e | 1 | 0 | 0 | 0 |

For each individual bit in succession, the following steps are performed in order of descending bit significance starting with a most significant bit (MSB) and continuing consecutively to the least significant bit (LSB):

for each current actively examined bit, viewed over all 5 input values, the median bit value, i.e. $3^{rd}$-largest bit value, is determined, which is 1 if the bit value 1 occurs at least 3 times at the current actively examined bit position among all 5 input values, and which is 0 otherwise;

the determined $3^{rd}$-largest bit value represents the bit value for the actively examined bit position of the output value, i.e. of the median; and for those input values or numbers, of which the bit value of the actively examined bit does not correspond to the determined $3^{rd}$-largest bit value, the bit values of the succeeding less-significant bits of these input values are changed or set to or replaced by the bit value of the actual actively examined bit, i.e. the bit value opposite that of the determined $3^{rd}$-largest bit value.

The MSB (bit 0) of the median must be 1, as the majority of the five MSBs of the five input values or numbers are 1; four MSBs are 1 and the associated numbers a, b, c and e thus exceed the number d with the MSB 0, so that one of the numbers with the MSB 1 must be the median. The remaining bits 1 . . . 3 of the median thus will be given by the third largest values among the bits 1 . . . 3 of the four numbers with the MSB equal to 1. If, in the number d with the MSB equal 0, one changes or replaces the subsequent bits 1 . . . 3 with the minimum representable value 000 (see the following table) and if all five numbers are then further examined, then the bits 1 . . . 3 of the median continue to be given by the third largest values among the bits 1 . . . 3—but now of all the numbers—and thus as the median of these values. In other words, once it has been determined by analyzing the most significant bit of each number, that one of the numbers a, b, c e must be the median, and the number d cannot be the median because it is too low, then the remaining subsequent bits of the number d are changed or replaced with "dummy bits" 000 so as to effectively take this number out of contention as the median in the evaluation of the subsequent bits.

|        | Bit |   |   |   |
| ------ | --- | - | - | - |
| Number | 0   | 1 | 2 | 3 |
| a      | ~~1~~ | 1 | 0 | 1 |
| b      | ~~1~~ | 0 | 1 | 0 |
| c      | ~~1~~ | 1 | 1 | 1 |
| d      | ~~0~~ | 0 | 0 | 0 |
| e      | ~~1~~ | 0 | 0 | 0 |
| Median | 1   |   |   |   |

In this way the remaining problem has been reduced to producing a median of still five numbers, however, with a word length of 3, i.e. reduced by one from the original word length. These numbers are shown in the above modified table (the MSB no longer to be examined is crossed-out). In order to determine the bit 1 of the median, again it has only to be checked whether for bit 1 more zeros or ones occur among the five input numbers. As a result it is determined that the bit 1 of the median equals 0. Thus, one of the three numbers b, d and e with the bit value of bit 1 equal 0 must represent the median with regard to bits 1 . . . 3, as the two numbers a and c with the bit value of bit 1 equaling 1 are higher than the median (which is now know to have the value 0 at this bit position 1). The remaining bits 2 . . . 3 of the median thus are given by the third smallest of the values, represented by the bits 2 . . . 3, of the three numbers b, d and e with the bit 1 equaling 0. If, for the numbers a and c with the bit 1 equaling 1, the bits 2 . . . 3 are substituted or replaced by the maximum representable value 11 (see the following table) and if all five numbers are then further examined, the bits 2 . . . 3 of the median further result as the third smallest of the values represented by the bits 2 . . . 3—but now of all numbers—and thus as the median of these values. In other words, a similar process as described above for the bit 0 has been carried out for the bit 1, but in this case the subsequent bit values of the numbers a and c are replaced by "dummy" bits 11 indicating that these numbers are higher than the median value and thus should be out of contention as the median value bits in the successive evaluation of the bits 2 and 3.

|        | Bit |   |   |   |
| ------ | --- | - | - | - |
| Number | 0   | 1 | 2 | 3 |
| a      | ~~1~~ | ~~1~~ | 1 | 1 |
| b      | ~~1~~ | ~~0~~ | 1 | 0 |
| c      | ~~1~~ | ~~1~~ | 1 | 1 |
| d      | ~~0~~ | ~~0~~ | 0 | 0 |
| e      | ~~1~~ | ~~0~~ | 0 | 0 |
| Median | 1   | 0 |   |   |

Consequently, the word length to be examined for producing the median has been further reduced by one—merely the median of the above shown five numbers with a word length 2 has to be produced, of the median thus are given by the third smallest of the values, represented by the bits 2 . . . 3, of the three numbers b, d and e with the bit 1 equaling 0. If, for the numbers a and c with the bit 1 equaling 1, the bits 2 . . . 3 are substituted or replaced by the maximum representable value 11 (see the following table) and if all five numbers are then further examined, the bits 2 . . . 3 of the median further result as the third smallest of the values represented by the bits 2 . . . 3—but now of all numbers—and thus as the median of these values. In other words, a similar process as described above for the bit 0 has been carried out for the bit 1, but in this case the subsequent bit values of the numbers a and c are replaced by "dummy" bits 11 indicating that these numbers are higher than the median value and thus should be out of contention as the median value bits in the successive evaluation of the bits 2 and 3.

|        | Bit |   |   |   |
| ------ | --- | - | - | - |
| Number | 0   | 1 | 2 | 3 |
| a      | ~~1~~ | ~~1~~ | 1 | 1 |
| b      | ~~1~~ | ~~0~~ | 1 | 0 |
| c      | ~~1~~ | ~~1~~ | 1 | 1 |
| d      | ~~0~~ | ~~0~~ | 0 | 0 |
| e      | ~~1~~ | ~~0~~ | 0 | 0 |
| Median | 1   | 0 |   |   |

Consequently, the word length to be examined for producing the median has been further reduced by one—merely the median of the above shown five numbers with a word length 2 has to be produced, whereby the evaluation proceeds analogously to the preceding steps. Since the bit value 1 prevails in bit position 2, the bit 2 of the median is given as 1. For the two numbers d and e with the bit 2 equaling 0 (and thus lower than the median value), the subsequent bit 3 is to be replaced by the minimum representable dummy value 0 (see the following table) to identify this number as being too low to be the median in the subsequent evaluation of the next bit position. With the number d this would not be necessary, as this bit has been modified accordingly in a previous step.

|        | Bit |   |   |   |
| ------ | --- | - | - | - |
| Number | 0   | 1 | 2 | 3 |
| a      | ~~1~~ | ~~1~~ | ~~1~~ | 1 |
| b      | ~~1~~ | ~~0~~ | ~~1~~ | 0 |

-continued

| Number | Bit | | | |
|---|---|---|---|---|
| | 0 | 1 | 2 | 3 |
| c | ≠ | ≠ | ≠ | 1 |
| d | 0 | ⊗ | ⊗ | 0 |
| e | ≠ | ⊗ | ⊗ | 0 |
| Median | 1 | 0 | 1 | |

At this moment, already 4 (a, c, d, e) of the 5 input values have been modified (with "dummy" bits as described above) and recognized as not being the median. Thus, the value of the one remaining number b already evidently results as the median and the process could already be terminated. A termination criteria of this type, however, causes additional expenditure, so that it is probably easier to perform the evaluation sequence also for the succeeding bit(s), here the LSB 3. As for bit 3 (LSB), the zeros prevail among the five numbers, so the LSB of the median results as 0 (see the following table).

| Number | Bit | | | |
|---|---|---|---|---|
| | 0 | 1 | 2 | 3 |
| a | ± | ± | ± | ± |
| b | ≠ | 0 | ≠ | 0 |
| c | ≠ | ≠ | ≠ | ≠ |
| d | 0 | ⊗ | ⊗ | ⊗ |
| e | ≠ | 0 | 0 | 0 |
| Median | 1 | 0 | 1 | 0 |

This determines the median fully and accurately. The determined median value 1010 corresponds with the third largest number b among the five input values. The determined median value can then be provided as the output value of the filtering process.

The underlying algorithm for determining the median of K numbers shall now be described in a general manner for the case of the sign-less binary representation.

Starting with the MSB and progressing successively to the LSB, the individual bits are to be processed in sequence as follows. At first it must be checked whether more ones or zeros occur for the examined bit b viewed over all K numbers. The bit value occurring more frequently represents the bit b of the median. For those numbers of which the bit b corresponds to the bit value that occurs less frequently (i.e. the binary bit value opposite the determined median bit value), all subsequent, i.e. less significant, bits are to be changed or set to or replaced with the bit value of bit b (i.e. the bit value opposite the determined median bit value) to the extent necessary, i.e. the subsequent bits that already correspond to the bit value of bit b can be replaced or left alone as desired.

For the other most common binary representations, only the significance of the first bit differs relative to the sign-less binary representation discussed above. In the one's or two's complement representation, the first bit continues to be the MSB—but with another significance. In the sign-value representation, the first bit is the sign bit (SB), which is followed by the MSB of the value. This results in a difference merely for the first bit in the sequential processing of the bits, whereas all the succeeding bits are to be treated as described above. Also, the determination of the first bit of the median remains unchanged; it always corresponds to the bit value occurring more frequently in the first bit of the K numbers. Solely the modification of the numbers having the less frequently occurring first bit value is different. Depending on whether these numbers do not exceed or lie below the median, the minimum or maximum value that can be represented with these bits is always to be used for replacing or modifying their subsequent bits. However, in the sign-value representation, the evaluation and further process must be carried out in terms of, or with consideration of, an interpretation with the sign of the median. In case of the one's or two's complement representation, for the numbers with the less frequently occurring MSB-value, all succeeding bits are to be equated with the inverse of the MSB-value. In the case of the sign-value representation, for the numbers with the less frequently occurring (sign bit) SB-value, all succeeding bits are to be equated or replaced with, or set to 0.

Figure 9C:
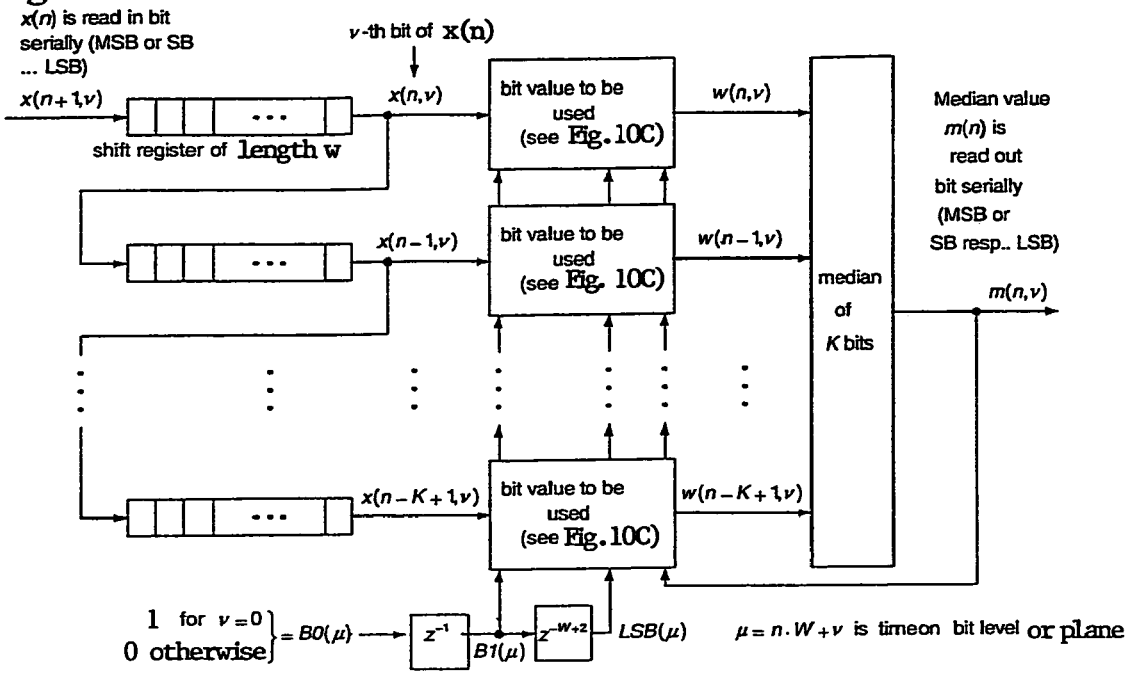
FIG. 9C shows an algorithm for implementing a median filter with a bit serial processing for binary data in a one's or two's complement representation.
Figure 10C:
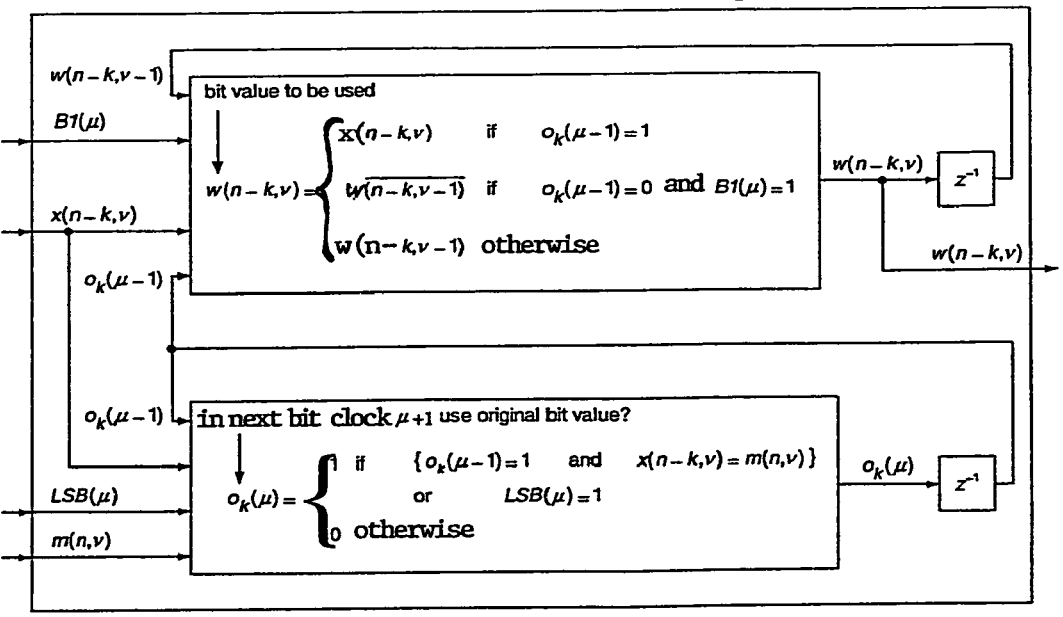

In FIGS. 9A, 9B, 9C as well as in FIGS. 10A, 10B, 10C, versions of the filter algorithm for calculating the median are shown in the form of a one-dimensional filter without decimation, FIG. 9A combined with FIG. 10A showing the configuration for input values in a sign-less binary representation, while FIG. 9B combined with FIG. 10B showing the modification for a sign-value representation of the input values, and FIG. 9C combined with FIG. 10C showing the modification for a one's or two's complement representation of the input values. The following issues are noted for the sake of explanation.

The input signal x(n) and the output signal consisting of the median values m(n) have the word length W, i.e. each time value consists of W bits. The individual bits are numbered with $\nu$, starting with $\nu=0$ for the MSB (most significant bit) in a binary representation which has no sign in FIGS. 9A, 10A and in a one's or two's complement representation in FIGS. 9C, 10C, or for the SB (sign bit) in a sign-value representation in FIGS. 9B, 10B, and ending with $\nu=W-1$ for the LSB (least significant bit). The bit $\nu$ of x(n) and m(n) is identified by x(n,$\nu$) and m(n,$\nu$)) respectively.

Time is identified by n on the level or plane of input and output signals, i.e. on the word level or plane, while time is identified by $\mu=n\cdot W+\nu$ on the bit level or plane.

The processing is bit serial, i.e. one bit after the other is processed, starting with the MSB or SB as applicable and ending with the LSB. Consequently, the entire filter structure, i.e. memory and logic, are clocked with the bit time $\mu$.

The input values required for calculating the median are stored bit by bit with the aid of K consecutive shift registers of the length W; here K is the median filter length.

Flag B0(p) marks the processing of bit 0; for $\nu=0$ it is 1 or otherwise it is 0. Flags B1($\mu$) and LSB($\mu$) mark the processing of bit 1 and of the LSB respectively; they are defined in an analogous manner and can be generated by delaying B0($\mu$) by one and W−1 clocks, respectively.

In the block "median of K bits" the median is produced bit by bit, i.e. the majority of zeros or ones among the K bits fed-in is determined.

In the $k^{th}$-block "bit value to be used" (k=0,1, . . . ,K−1 is viewed from the top), which in detail is shown in FIGS. 10A, 10B and 10C respectively, on the one hand the $k^{th}$-bit value w(n−k,$\nu$) for the bit by bit producing of the median is determined: this is either the original value x(n−k,$\nu$), i.e. the examined bit $\nu$ from the input value x(n−k), or an accordingly modified value. On the other hand it is determined whether in the next bit clock $\mu+1$ the original value or an accordingly modified value is to be used, which is marked by the flag $o_k(\mu)=1$ for the modification not effected so far and $o_k(\mu)=0$ for the modification already effected. Here, the rule according to the procedure as described above is taken into consideration, i.e. that after the first use of a modified value this value has to be used thereafter until the end of the respective time step n. Subsequently, i.e. with LSBμ=1 the flag is reset, i.e. for the next output value at first the unmodified input value is again taken into consideration.

Initialization of the memories (shift register as well as delayer or delay line) depends on the desired starting behavior of the filter.

Hereinafter this new median filter structure shall be considered in terms of its expenditure and complexity in case of a hardware implementation (e.g. on an ASIC or FPGA).

The bit by bit producing of the median, i.e. the determination of the majority of zeros or ones among the K bits fed-in, is the central block of this structure. A possible strategy for implementing this block, suitable in particular for larger filter lengths K, is based on summation of the bit values (which are each either 0 or 1). If the bit sum is $\geq(K+1)/2$, then the bit median is 1, otherwise it is 0; the comparison can be implemented via subtraction and subsequent checking for conformity with regard to the sign. The summation of the bits, for instance, can be implemented in graduated parallel form, in which the number of the parallel single adders diminishes and their word length increases from step to step; on the one hand that minimizes the critical path and thus the required passing or throughput transit time and on the other hand keeps the required word lengths and thus the expenditure as low as possible. Minimization of the critical path is particularly important in case a high clock time of the filter is demanded, as the bit by bit producing of the median lies in a recursive loop and, therefore, pipelining must be excluded. For small filter lengths there are special solutions optimized for the used hardware for implementing the bit by bit producing of the median. As an example to be explained next, the filter length is K=5 and the implementation is carried out on a commercially available FPGA, which as a basic module has look-up-tables (LUTs) with four logic inputs and a logic output. In such a case, three of these LUTs are required for the bit by bit producing of the median.

The K identical blocks "bit value to be used" require each only two delayers or delay lines (FIFOs) as well as a very simple logic (in the above example 2 LUTs).

The K shift registers for storing the input values require in many cases (in particular if the word length W is relatively large) considerably higher expenditure than the rest of the filter structure, what speaks in favor of the efficiency of the filter logic. It has to be noted that storing K input values in each median filter is necessary, independent of the structure.

The new median filter is scalable, provided that the bit by bit determination of the median is implemented via summation. Namely, if the filter length K is changed, merely the number of the shift registers being used, the number of the identical blocks "bit value to be used", the number of the bits to be added up, as well as the value to be compared with the bit sum have to be adapted.

The new median filter structure has the characteristic or feature that the producing of the median for each input value, i.e. each time step n, is restarted completely from the beginning, which means that contrary to the most common structures it does not resort to results of previous time steps; for instance with sorting procedures in general it is started from the sequence determined in the preceding cycle. Due to this feature, the new algorithm for calculating a median is especially suitable for filtering with decimation. For this purpose in the filter structure only the shift registers are to be fed with values in a modified manner. Thus with a decimation by the factor L=2, the two top shift registers are to be fed in parallel with two consecutive input values, and in the coupling of the shift registers one of them is respectively skipped. With a decimation by the median filter length, i.e. L=K, the shift registers are no longer coupled, but are fed parallel with K consecutive input values. With decimation, the clock rate of the input signal x(n) that can be processed at maximum by the filter structure can be increased by the decimation factor L.

For hardware implementation of the digital filter, the new algorithm for calculating the median in many cases leads to considerable reduction of the required expenditure; this mainly depends on the clock rate and on the word length of the input signal, on the degree of decimation, the technology being used and the available logic.

So far only the most common binary fixed point representations (unsigned binary two's complement, one's complement or sign-value representation) have been examined. For other binary fixed point representations, the new algorithm for calculating the median can be described in an analogous manner and also becomes apparent from the following description for more general rank filters.

Instead of determining especially the (K+1)/2-largest value (i.e. the median) among an odd number K of values, it is also possible to examine a value with a different rank, i.e. in general the $R^{th}$-largest value, R=1,2, . . . ,K, and to allow at the same time any whole number for K. The filter based thereupon is called a rank filter herein, because it can select or filter a value of any desired rank or relative value size among plural input values. The rank filter determines the $R^{th}$-largest value among K consecutive or adjacent values of a one- or multi-dimensional input signal, and can be used, for example, in connection with an ordered statistics of an input set of values.

The new filter algorithm for producing a median as presented above can easily be extended to a more general rank determination, as described in the following. The present method can be used in connection with input values in any binary number representation in fixed point format, for which the respective value of the bit significances diminishes (and particularly is divided by half) for each successive bit position from the MSB toward the LSB, for which only the bit values 0 and 1 occur (e.g. not −1 as in the CSD-code), and for which there may optionally be an additional sign bit (SB).

For determining the $R^{th}$-largest of K numbers, the individual bits b, b=0,1, . . . ,W-1, are to be consecutively processed in terms of a bit significance descending in value starting with the MSB or SB if applicable and progressing to the LSB, as follows. At first with the bit b to be examined viewed over all K numbers, either the $R^{th}$-largest or the $R^{th}$-smallest bit is to be determined—namely the $R^{th}$-largest bit if the significance of the bit examined is positive or if the examined bit is an SB with value 1 for positive and value 0 for negative numbers, or the $R^{th}$-smallest bit in the opposite cases. For number representations with a sign bit SB, the sign known from the SB of the $R^{th}$-largest number is to be included in evaluating the significance of bits succeeding the SB. The bit value (0 or 1) received this way is the bit b of the $R^{th}$-largest number. For those numbers of which the respective bit b differs from the determined $R^{th}$-largest value (i.e. those numbers already known not to be the number of the desired rank R), all of the succeeding bits b+1 . . . W-1 thereof will be replaced by or set to the minimum or maximum value that can be represented by these bits, depending on whether these numbers do not exceed or lie below the $R^{th}$-largest number in terms of the values presented by the bits b . . . W-1. For number representations with a sign bit SB, the sign of the $R^{th}$-largest number is to be included in evaluating the bit significances for the values presented by the bits a . . . W-1, if a>0.

In turn this new algorithm for general rank generation can be converted into a filter structure that can be implemented in a very simple manner. For the case of a one-dimensional filter without decimation, only the following differences arise in comparison to the median filter structure shown in FIGS. 9A and 10A, 9B and 10B, 9C and 10C.

Instead of the median of K bits, the $R^{th}$-largest or $R^{th}$-smallest of K bits is to be determined. In addition there is a block that determines whether the $R^{th}$-largest or the $R^{th}$-smallest bit is to be determined, i.e. which special case is on hand. Note that determining the $R^{th}$-smallest value corresponds to or is covered by determining the $X^{th}$-largest value, whereby X=K−R. In this regard, reference is made to the processing steps in the claims, which define the conditions and adaptations of the steps respectively.

The blocks "bit value to be used" are to be modified accordingly. In such case the output signal of the filter is the respective $R^{th}$-largest value.

Determination of the $R^{th}$-largest or the $R^{th}$-smallest bit again can be realized with the aid of summation of the K bit values. If the $R^{th}$-largest bit is to be determined, the $R^{th}$-largest bit equals 1 if the bit sum of this bit of all the input values is ≧R, otherwise it is 0. On the other hand, if the $R^{th}$-smallest bit is to be determined, the $R^{th}$-smallest bit equals 1 if the bit sum of this bit of all the input values is ≧K+1-R, otherwise it is 0.

For digital signals in the time or frequency domain which have a useful level over the noise level only for single discrete values, typically a so-called noise threshold is to be determined, above which the signal level is interpreted as a useful level and is used further. Therefore, the noise threshold often is called a detection threshold. For determining the noise threshold, a rank filter and preferably the above described rank filtering method can be used. In the example of a pulse modulated Doppler radar system, the spectral detection thresholds can be determined e.g. by the $99^{th}$-smallest value in the power spectrum of the length 128.

Hereinafter the invention shall be presented in an example embodiment when being used in a radar system in particular for a passenger car.

Modern motor vehicles are increasingly provided with a distance control system based on radar, which detects the distance, velocity and relative angle of the motor vehicle running ahead.

A known radar system of such kind for instance is the FMCW-system (Frequency Modulated Continuous Wave) developed by the company Bosch, in which two physical values, i.e. the distance and the relative velocity of a moving or standing body, are mapped to one physical value, i.e. the frequency. For this purpose signals are permanently transmitted and the signals reflected by the moving body are received. Conclusions can be drawn as to the searched values (i.e. values of interest to be determined) from the frequency response curve of transmitted and received signals and from the frequency difference of these signals respectively. A separation of velocity and distance is possible by evaluating several signals, the so-called chirps, with different frequency slope. Two chirps would be sufficient for a single target. For multi-target situations at least three chirps are needed.

For operating a radar system of such type in particular an oscillator (VCO) with low phase noise is required, which provides preferably linear frequency ramps, what is not possible offhand and what makes the RF-part of the radar system very elaborate. In traffic situations with many different targets, as it is often the case with guardrails and in city centers, problems arise with the target detection and separation, as all targets are present in an antenna radiation in each associated chirp spectrum.

Therefore, exact extraction of the different targets is not possible or it does not always meet one's expectations.

To avoid these problems, the pulse modulated Doppler radar system provides a solution. With this method a target is mapped to one or more consecutive distance gates. The received signal is sampled appropriately. The exact distance can then be gained from the amplitude ratio of the sampled values in consecutive distance gates.

However, the pulse modulated Doppler system has a low signal-to-noise ratio (S/N) based on the reduced medium or average output power. Due to the broadband receiving path, this radar system is also more sensitive to interferences.

For recognizing the sign of the velocity, the pulse modulated Doppler method performs complex sampling of the received signal. Radar systems according to the pulse modulated Doppler method are characterized in that the velocity and the distance represent direct measured quantities. Compared to the FMCW-system mentioned above, the RF-part can be implemented more easily, as here a free-running oscillator (VCO) with low requirements regarding its phase and amplitude noise can be used, and as no frequency ramps have to be produced.

With such a radar system, for a measuring cycle, a plurality, e.g. 1024, of transmit pulses are evaluated or analyzed per reception antenna. Their (time) spacing is then e.g. 2.5 µs. In addition, the (time) spacing is pseudo-noise encoded to avoid trappings and interferences.

When using a large number of transmit pulses, more accurate velocity measuring and a high integration gain are possible and beyond that, the noise produced due to the pseudo-noise encoding is low so that a more optimum signal-to-noise ratio can be achieved.

In FIG. 1A for a pulsed system, the amplitude or envelope $\hat{s}(t)$ of the transmitted wave of the frequency $f_s$ is shown for the case of rectangular pulses. The moments at which the transmit pulses begin are designated herein with $t_p(n)$. The distance, i.e. the time spacing, between two consecutive pulses is called the pulse repeat time $T_{PW}(n)$.

If this wave with the propagation velocity c is reflected on an object at the distance a, after the running or transit time Δt=2a/c the system receives the reflected and in general damped wave e(t). In FIG. 1B the amplitude or envelope $\hat{e}(t)$ of the received wave is shown. Thus one can conclude or ascertain the distance of the object from the running time Δt, as long as the running time Δt is always smaller than the pulse repeat time $T_{PW}(n)$; otherwise ambiguity problems do arise—they are referred to as trappings. If the object detected by the wave moves with the relative velocity v relative to the measuring system, then the reflected wave received by the system shows a frequency shift by the Doppler frequency $f_d=2f_s v/c$. Thus one can conclude or ascertain the relative velocity v from the Doppler frequency $f_D$.

In FIG. 1C, the amplitude or envelope $\hat{e}(t)$ of the received wave is exemplified for trappings or interferences of another pulsed system operating in the same frequency range.

The starting point for suppressing trappings or interferences is a pseudo-noise encoding of the pulse repeat time $T_{PW}(n)$, i.e. the pulse repeat time is not constant, but is variable according to a random process. Received pulses, which derive from trappings or from another pulsed system, then exhibit a time spacing or delay after the pulse transmitted directly before, which is not always identical but rather has a duration that is stochastically distributed.

Preferably, the received signal e(t) is sampled after being suitably processed (e.g. by mixing to an intermediate frequency or into the base band, IQ-production, filtering). For this purpose the sampling times or moments are chosen such that they have a time spacing $t_A(m)$, $m \in \{0,1,\ldots,M-1\}$ with regard to the preceding transmit pulse time $t_P(n)$; each time spacing $t_A(m)$, $m \in \{0,1,\ldots,M-1\}$, corresponds to a so-called distance gate. For each of the M distance gates altogether N(m) sampled values are produced per cycle; it is not relevant for the further examination in which manner this is effected, i.e. whether serially or parallel.

With trappings and interferences by pulsed systems working in the same frequency range, due to the pseudo-noise encoding of the pulse repeat time $T_{PW}(n)$ generally only individual sampled values are disturbed in each distance gate—they are called transient disturbers. But in the case of high interference levels, this could suffice for the further signal processing (spectral analysis for Doppler determination e.g. by means of FFT or power analysis e.g. by power integration) to deliver useless results. FIG. 2A1 shows by way of example a sinusoidal oscillation in the discrete time domain, which is superimposed by numerous high interfering impulses; in the spectrum of the resulting signal shown in FIG. 2A2, the spectral peak of the sinusoidal oscillation has disappeared in the noise produced by the interfering pulses.

This is when the median filtering can be applied. Preferably, the median filter lengths shall be chosen ever larger, the more values could be disturbed; with a power analysis the median filter lengths can be chosen as far as to the number N(m) of sampled values, while in the case of a spectral analysis for Doppler determination the median filter lengths are limited by the maximum Doppler frequency to be detected (due to the low-pass character of median filters), which necessitates oversampling.

For the disturbed signal as shown in FIG. 2A1, the course shown in FIG. 2B1 results after filtering in a two-stage median filter with a respective filter length of K=5. The useful signal, a sinusoidal oscillation, is nearly completely reconstructed in the time domain of FIG. 2B1 and thus is clearly visible in the spectrum of FIG. 2B2.

Consequently, if the pseudo-noise encoding of the pulse repeat time is combined with the median filtering as a non-linear filtering suitable for suppressing transient disturbers, the influence of trappings and interferences by pulsed systems working in the same frequency range can be strongly diminished or entirely eliminated. Moreover, at first preferably an adequate pre-processing of the sampled values is provided in each distance gate, such as e.g. a value squaring for a power analysis.

On the basis of a block diagram, FIG. 3 shows the pulse modulated Doppler radar system in accordance with the invention. The individual elements of this system, in particular the optimum filter and the elements of the FPGAs are described in detail below.

The radar system comprises an RF-reception or receiver part 10 with a downstream amplifier 12, band pass optimum filter 14 and A/D converter 16. At the output of the A/D converter 16, a complex output signal can be picked off or tapped, which can be fed to a downstream FPGA 20. The FPGA 20 includes a digital modulation system 22, the median filter 24 against interferences in the form of pulses, and a decimation filter 26 embodied as a low-pass, which are arranged and connected in series. The FPGA unit 20 further includes a PN (pseudo noise) generator 28. In addition, a noise filter 18 is provided, which precedes the A/D converter 16.

After the FPGA 20, a digital signal processor (DSP) 30 is next in line, and in the present case comprises a system for producing a window function 32A, an FFT-system (Fast Fourier Transformation) 32B as well as an interference line compensator 32C. Subsequently, starting from this the detection threshold is determined in block 34 and is fed to a system 36 for targeting, which produces a target list. Next in line after the DSP 30 is a micro controller unit (MCU) 40, which, starting from the target list, produces control values for the vehicle as needed. For this purpose, at first tracking of the target list is performed in block 42, and a relevant object is determined in block 44. The information on this is fed to a longitudinal controller or regulator 46, which then produces the desired control values. The function of the DSP 30 and of the MCU 40 can, of course, alternatively be fulfilled by a single program-controlled unit, for instance by a micro computer.

Figure 4:
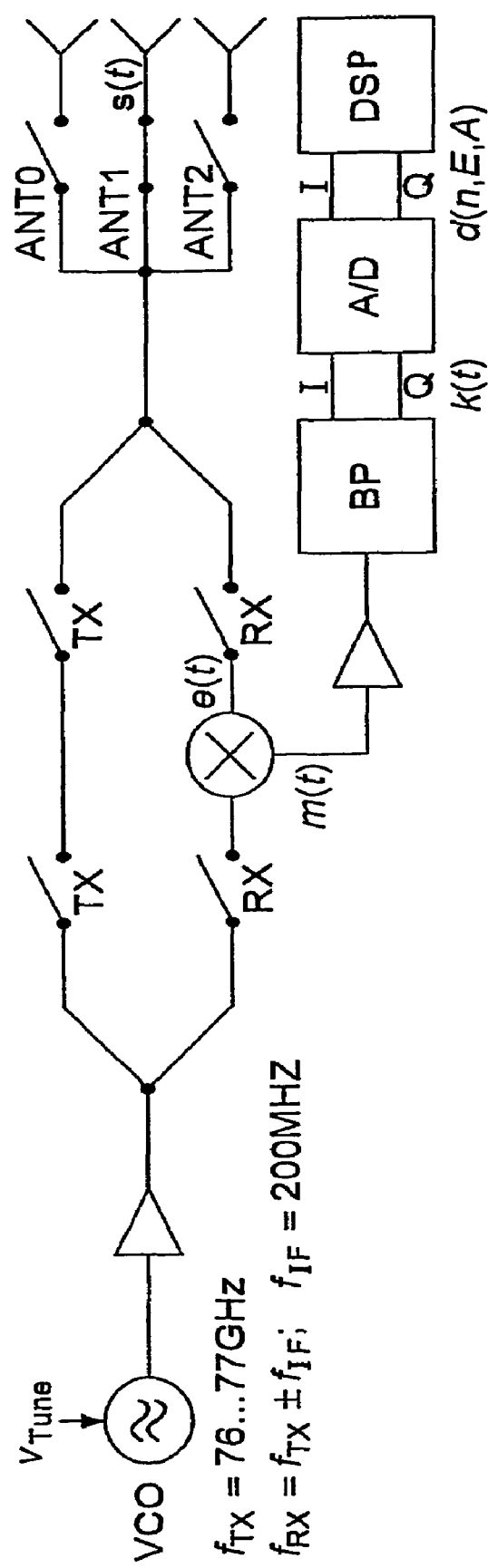
FIG. 4 is a simplified schematic circuit diagram for explaining the principle of the Doppler method.
Figure 5A:
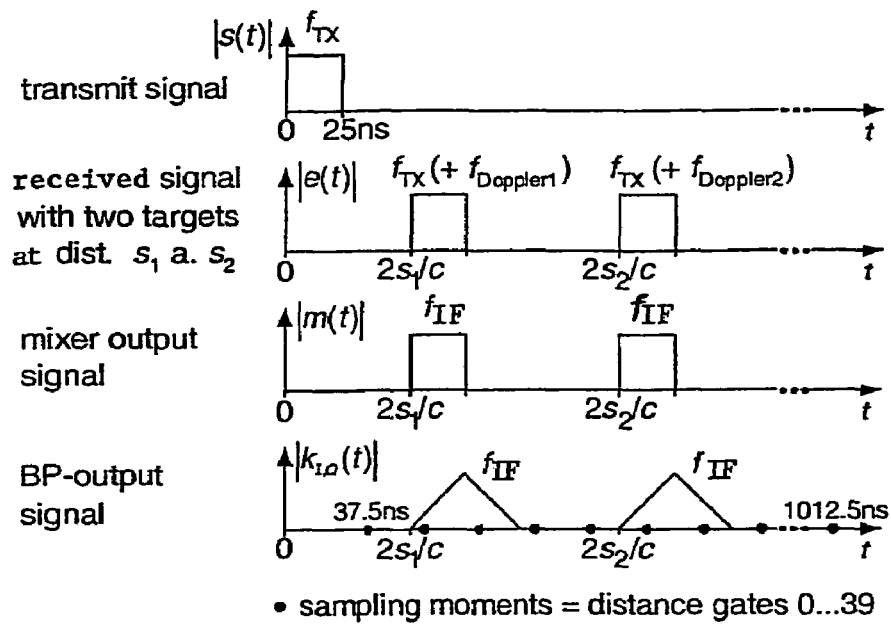
FIGS. 5A, 5B and 5C are signal-time/sample graphs for the several identified signals in the circuit diagram according to FIG. 4.
Figure 5B:
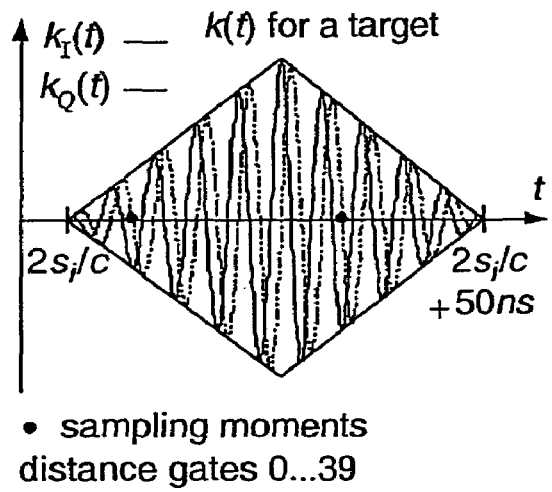
Figure 5C:
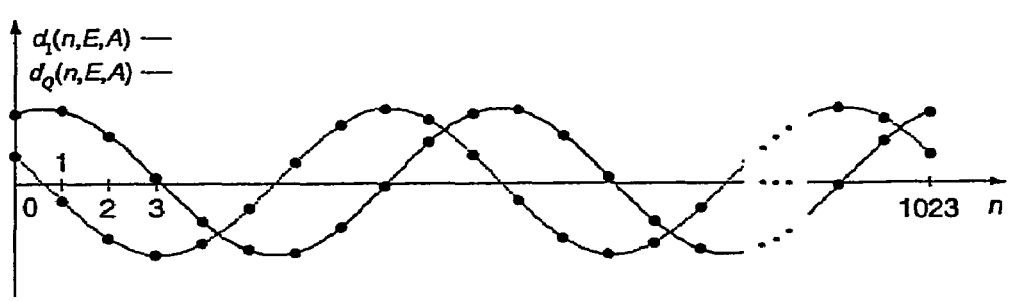

Hereinafter the Doppler method shall be described in short by way of FIGS. 4 and 5. FIG. 4 shows by way of a simplified diagram the principle of the Doppler method and FIGS. 5A, 5B and 5C show the signal-time graph for the signals in the diagram according to FIG. 4.

With the Doppler method, a complex sampling of the received signal is performed to recognize the sign of the velocity. Radar systems with the pulse modulated Doppler method are characterized in that the velocity and the distance represent direct measured quantities. Compared to the FMCW-system mentioned above, the RF-part can be implemented more easily, as here a free-running oscillator (VCO) with low requirements regarding phase and amplitude noise can be used, and as no frequency ramps have to be produced.

A measurement cycle takes for example 50 ms each. The measuring result is a target list, i.e. a snapshot of the traffic situation. To each measurement cycle, 5 measurement blocks are associated, namely an interference line measurement block, an I.F.-measurement block as well as three antenna measurement blocks (one for each antenna). Each of these measurement blocks takes 2.76 ms. In this time for instance 1024+64 transmit pulses are produced, the first 64 transmit pulses serving for the start-up transient effect of the filters and thus not being used for evaluation. After each transmit pulse, sampling is performed 40 times at intervals of 25 ns each. This ensures that each target is detected in at least one distance gate.

Via the switches ANT0 to ANT2 one of the three antennas is selected. By closing the transmit switches TX for 25 ns, the signal of the oscillator is provided to the selected antenna and is then radiated from this antenna.

After this transmitting of a rectangular transmit pulse, the reception switches RX are closed and the frequency of the oscillator is changed by 200 MHz. In this way the received pulses are transformed via the mixer to an intermediate frequency of 200 MHz. The Doppler shift of the frequency must not be considered at this point. The real signal m(t) resulting this way is transmitted to a passive band pass embodied as an optimum filter, which has two outputs orthogonal to each other with an identical amplitude and thus produces the complex signal k(t), i.e. an IQ-signal has been realized without a complex mixing.

After each transmit pulse, the IQ-signal at the output of the band pass filter is sampled 40 times at time spacings or intervals of 25 ns. The individual sampling times or moments correspond to one distance range each—they are so-called distance gates with a width of 3.75 m which reach as far as to a distance of 150 m. As a rectangular receiving pulse with a length of 25 ns is smoothed by the band pass filter to a triangular pulse of double the length and thus is generally visible in two consecutive distance gates, the exact distance can be interpolated by analyzing or evaluating the amplitude ratio of these two distance gates (see FIG. 5B).

For detecting the relative velocity of the targets with regard to one's own vehicle and for increasing the signal-to-noise ratio, the complex receiving signals of 1024 consecutive transmit pulses are analyzed in each distance gate E, without changing the selected antenna A. For the case of equidistant transmit pulses, FIG. 4 shows the real and imaginary part $d_I(n,E,A)$ and $d_Q(n,E,A)$ of the 1024 complex sampled values $d(n,E,A)$ of one distance gate, in which there is a relatively moving target. During the short observation period of 2.56 ms for the 1024 sampled values the relative velocity can always be considered as constant. The phase changes uniformly from sampled value to sampled value, as the distance of the target and thus the phase of the receiving pulse change uniformly—exactly the Doppler frequency including its sign results (since the signal is complex).

The method just described is used sequentially for each of the three antennas. One of the antennas is oriented or "looks" exactly straight forward, whereas the two others are directed somewhat to the left and right respectively to be able in this way to determine the position of the detected targets relative to one's own driving lane.

The received signal always contains an interference portion or component, which can be noticed as a noise. The interference has approximately the characteristics of random white noise. In order to filter out this noise as well as possible, i.e. to achieve a maximum signal-to-noise ratio, an optimum filter is used. Its transfer function corresponds to the spectrum of the received intermediate frequency pulses (I.F.-pulses), i.e. to the spectrum of a rectangle modulated at 200 MHz with the pulse length 25 ns. Thus the optimum filter corresponds to a band pass.

Advantageously, the used optimum filter is realized as an LC-quadrupole embedded in ohmic resistances. In the examined frequency range this is an especially low-budget and flexible technology, as the inductances needed here are available as SMD-components. With this the filter circuit can be established in a very simple, small and thus also cost-effective manner.

When designing an optimum filter of this type in accordance with the known method according to Bader, two design strategies are possible:

1. At first a low-pass adapted to the requirements is designed. Subsequently, from it the low-pass is transformed into a band pass. However, this model is only contingently suitable and only for special circuits, as it leads to structures and component values that are unsuitable for implementing the circuit.

2. Direct design of a band pass filter: This model is in particular advantageous, although somewhat complex in its design, as it leads to different alternative structures, which, depending on the requirements, are more or less well adapted to the demanded circumstances. With this method at first an approximation of the ideal transfer function is performed.

Figure 6:
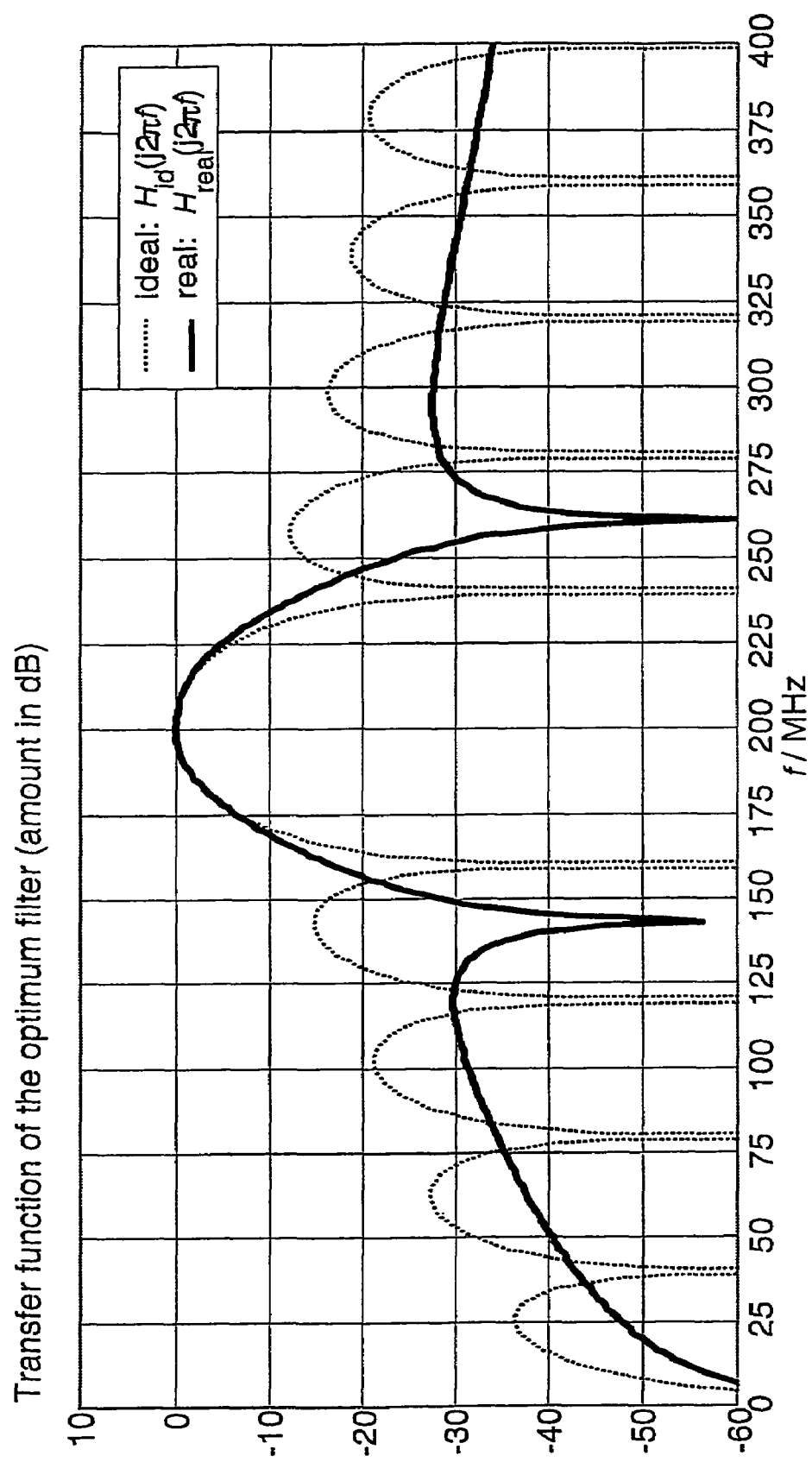
FIG. 6 shows the transfer functions of an ideal and of a real optimum filter.

FIG. 6 shows in dashed lines the transfer function of an optimum filter produced in the direct design; whereas the thin continuous curve belongs to the ideal optimum filter, which is approximated and reproduced very well by the real circuit.

FIG. 7 shows a first circuit arrangement for the implementation of an optimum filter approximated in accordance with Bader; here the values of the inductances, capacitances and resistances are rounded to real available values Degrees of freedom in development have been exploited here such that advantageously no transformer is necessary. Contrary to its dual structure, the structure shown in FIG. 7 has ground capacitances from nearly all nodes, in which the stray capacitances can be included.

The output signals $k_I(t)$ and $k_Q(t)$ of the circuit in FIG. 7 are mutually orthogonal, i.e. they have a phase difference of 90° to each other, and have an identical amplitude at the intermediate frequency $f_{IF}$=200 MHz, what can be achieved by means of degrees of freedom in the design and development.

The complex output signal $k_I(t)+j*k_Q(t)$, hereinafter called the IQ-signal, thus is a complex oscillation for the real input oscillation with the intermediate frequency $f_{IF}$. This so-called IQ-signal has been implemented in an advantageous manner without any mixing.

It is particularly advantageous if the parts of the output signal respectively associated with the real part and the imaginary part, i.e. $k_I(t)$ and $k_Q(t)$, are embodied grounded. By way of a circuit diagram, FIG. 8 shows a second preferred example embodiment of an approximated optimum filter, which takes this demand into account. Basically, the output-side part of the filter circuit has been doubled in this regard.

The further great advantage of this modified output stage shown in FIG. 8 is that the I/Q-character of the output signal is maintained despite the ohmic and capacitive load by the A/D converter. Merely the filter characteristic changes marginally.

Consequently, a band-pass optimum filter embodied according to FIGS. 7 and 8, in summary, comprises the following advantageous functions:

The filter has an optimized signal-to-noise ratio.

The filter produces, in a simple but quite reliable manner, an IQ-signal that is accurate to the greatest possible extent, which can be picked off or tapped at the output of the filter.

As the rectangular output signal is visible in two distance gates, and as the distance can be determined via the amplitude ratio, easy interpolation of the distance is possible in this way.

In FIG. 3, the FPGA block 20 comprises a system 22 for digital modulation of the complex output signal produced by the optimum filter 14. A system of this type is necessary since the velocity range of interest typically is not symmetric and as a result would lead to an asymmetric frequency range; in the example of use given herein, velocities in the range of −88.2 to +264.7 km/h are of interest. By means of a frequency offset of −12.5 kHz a symmetric frequency range can be produced from it. By means of a suitably dimensioned system for digital modulation this can be implemented, for instance by multiplication of the sampled IQ-signal with a signal, which is produced by a circulating complex phasor of the amplitude 1 and the rotary frequency −12.5 kHz.

The FPGA block 20 further comprises a non-linear filter 24 against interferences in pulse form. Pulse interferences are caused e.g. in trappings or pulse-radar systems of other road users. Pulse interferences are distributed to all distance gates (more or less uniformly) by a pseudo-noise encoding of the sampled moments. Thereby, only individual values are disturbed by interference in each distance gate. Undesired pulse interferences can be compensated by pseudo-noise encoding and by non-linear filtering, for instance by median filters.

For implementing the filter 24 against pulse interferences the following difficulty is to be considered. In this case a linear filter is hardly advantageous, since the decimation low-pass 26 succeeding the filter is already a linear filter with a minimum bandwidth. All non-linear filters that can compensate individual error values may be used according to the invention; however, many of these filters are problematic with regard to stability and implementation on an FPGA.

Here, advantageously a one- or multi-step or -stage median filter is to be used. In a preferred embodiment this filter is two-step with a respective length of 5 values in each step or stage. Advantageously, oversampling is performed by the preceding A/D converter.

The median of K values is the middle value, i.e. the $(K+1)/2$-smallest value=$(K+1)/2$-largest value among the K values.

For instance, the median of the five numbers 5, 3, 2, 79, 1 is the $(5+1)/2$ smallest (or largest) number, i.e. the $3^{rd}$ smallest (or largest) number among the five numbers, namely the number 3. A sliding median filter without reduction of the sampling rate computes at each moment n the median of K consecutive values of an input sequence x(n) and produces from it an output signal m(n). Many algorithms are known for median filters, which are particularly suitable for a software implementation. They are based on sorting with an accompanying high computing time or statistic analysis with accompanying high memory capacity for data. For a hardware implementation these algorithms are hardly suitable, as they typically require too many case differentiations and branchings.

However, a new algorithm for a hardware implementation of a median filter has been developed now: the operating mode has been described above by way of FIGS. 9A, 9B, 9C and 10A, 10B, 10C. With such structure the expenditure and effort for a median filter can be clearly reduced in many cases, in particular if the maximum clock time of the FPGA is significantly larger than the word cycle of the input signal. A further advantage is the simple scalability of the structure.

The FPGA block 20 in FIG. 3 further comprises a decimation filter 26. Advantageously, the decimation filter 26 is embodied as a low-pass (LP). In the present example embodiment, a decimation of the sampling frequency of 400 kHz to 50 kHz is performed, i.e. by the factor 8. This enables an improvement of the signal-to-noise ratio by 9 dB, in the case of an ideal decimation low-pass.

Figure 11:
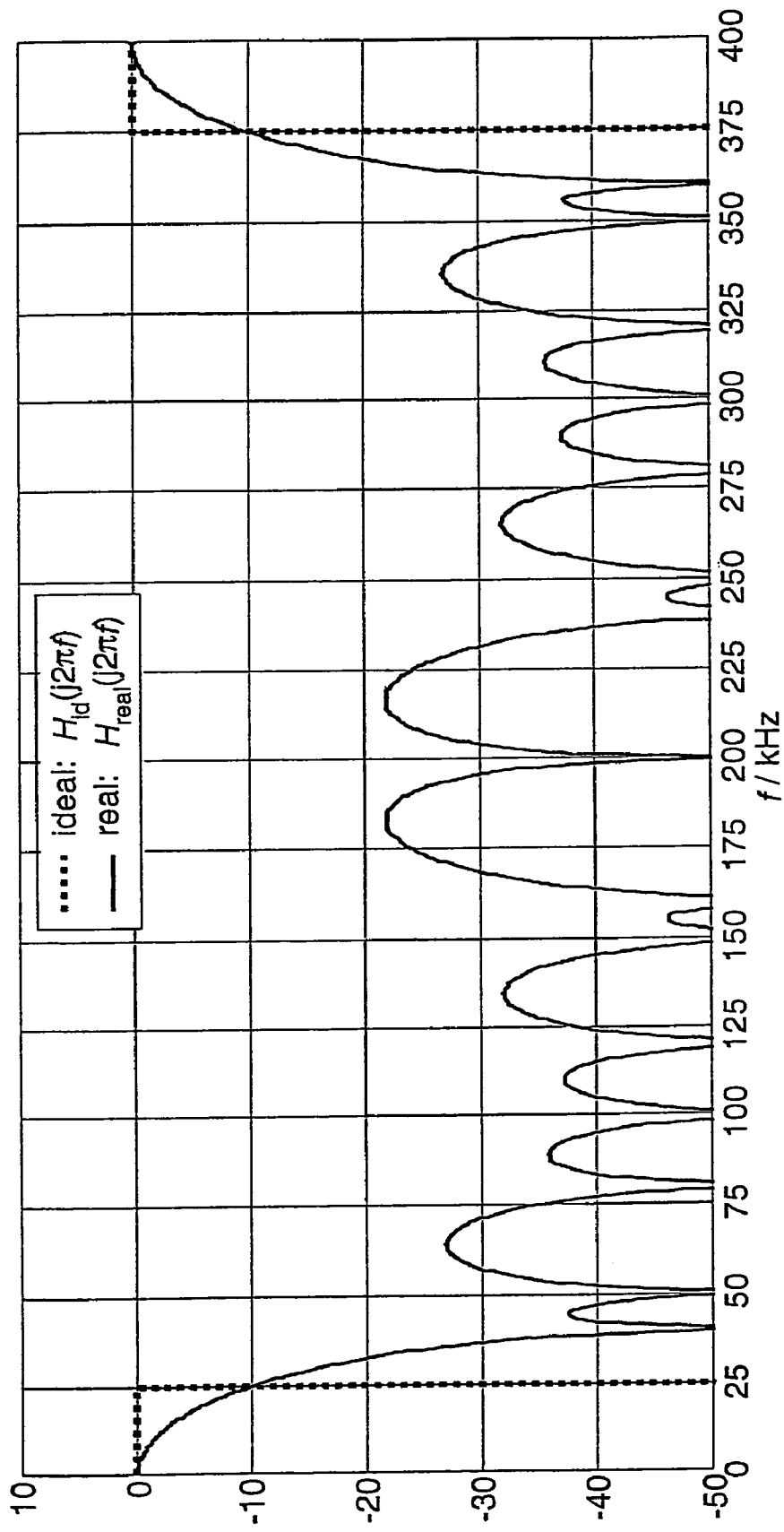
FIG. 11 shows the transfer functions of an ideal and of a real decimation low-pass.
Figure 12A:
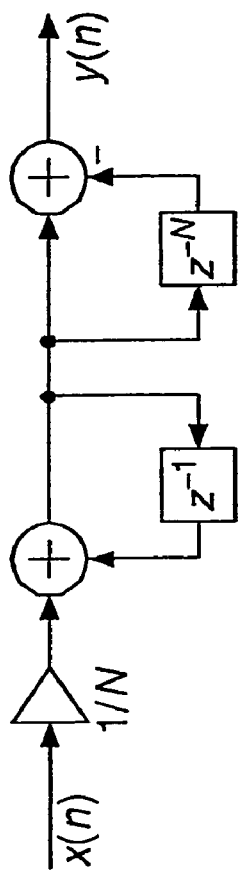
FIGS. 12A and 12B show the pulse response h(n) of a sliding-type mean value generator as well as a signal flow chart.
Figure 12B:
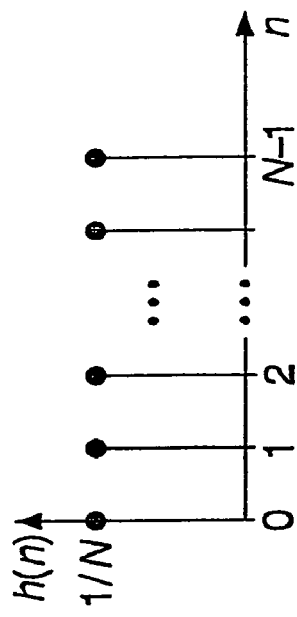

A real decimation low-pass must meet the requirements of signal flanks or edges that are as steep as possible around the frequencies of about f=±25 kHz. It is not necessary that $|H_{real}(j2\pi f)|\approx$constant in the transmission or pass band $|f|<25$ kHz, as in the analysis or evaluation merely spectra are evaluated and in doing so amplitude errors can be compensated in an easy manner. In FIG. 11 the transfer functions of an ideal and of a real decimation low-pass are shown. The low-pass used here consists of two sliding-type mean value generators, the second already working with the halved input clock rate. The sliding-type mean value generator of the length N averages over the current value and the N-1 preceding values. FIG. 12A shows the pulse response h(n) of such a sliding-type mean value generator, and FIG. 12B shows a pertinent signal flow graph. The mean value generator can be implemented very efficiently in recursive form.

Figure 13:
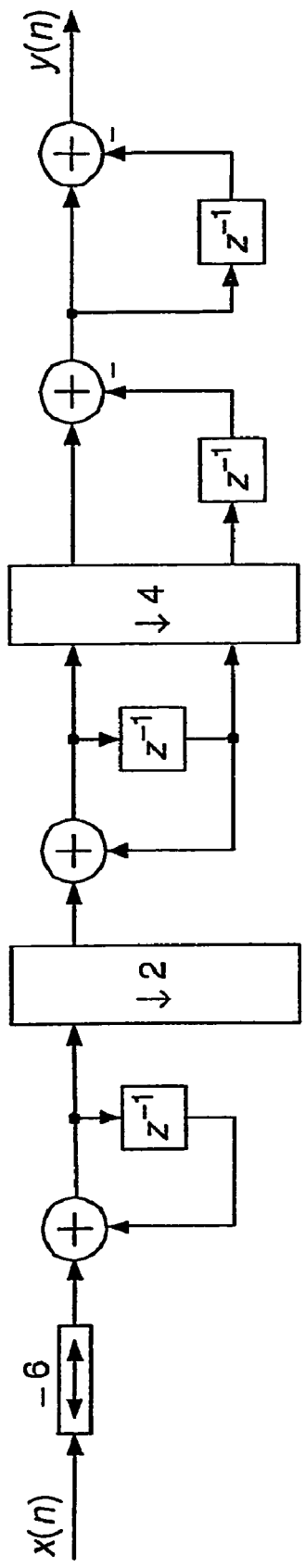
FIG. 13 shows an advantageous example embodiment of a decimation low-pass.

The entire structure of an advantageous example embodiment of a decimation low-pass is shown in FIG. 13. An absent factor 64/40 at the output is also implemented in a subsequent windowing for the digital Fourier Transformation (DFT). Consequently, for a decimation filter of this type with the degree 15, the following elements must be provided: a shifter, four adders, and four memory elements. However, a multiplier is not required. As a comparison, with a usual linear-phased filter with the degree 15, altogether eight multipliers, 15 adders, and 15 memories must be provided. Therefore, the decimation filter is also characterized by a clearly lower circuit expenditure.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of non-linearly digitally filtering K input values to produce an output value corresponding to an $R^{th}$ greatest value among said K input values with $K \geq R \geq 1$, comprising the steps:

a) providing said K input values, each respectively in a signed binary fixed-point numerical representation having plural numerical bits in order of a respective bit significance thereof from a most significant bit to a least-significant bit in succession, wherein each one of said numerical bits has a bit value of only 0 or 1, said bit significance diminishes by a factor of ½ from each one of said numerical bits to a next one of said numerical, bits in succession from said most-significant bit to said least-significant bit, and said numerical representation of each one of said K input values respectively may further optionally include a sign bit;

b) if said numerical representation does not include said sign bit then skipping the remainder of this step b), otherwise if said numerical representation includes said sign bit then evaluating said sign bits of said K input values as follows:

b1) if all of said input values are non-negative values or all of said input values are non-positive values then skipping the remainder of this step b);

b2) if there are at least R non-negative values and at least one negative value among said K input values then setting an output sign indicator as non-negative and setting all of said numerical bits of all of said at least one negative value to 0;

b3) if there are fewer than R but at least one non-negative value among said K input values then setting an output sign indicator as negative and setting all of said numerical bits of all of said at least one non-negative value to 0;

c) after said step b), selecting a respective current selected bit among said numerical bits of each of said K input values beginning with said most-significant bit and progressing successively with said bit significance diminishing toward said least-significant bit;

d) after said step c), determining a respective output bit of said output value for said respective current selected bit of said K input values as follows:

d1) if said numerical representation does not include said sign bit or if at least R of said K input values are non-negative values, then setting said respective output bit to 1 if said bit value 1 occurs at least R times as said current selected bit among said K input values and otherwise setting said respective output bit to 0; or d2) if fewer than R of said K input values are non-negative values, then setting said respective output bit to 0 if said bit value 0 occurs at least R times as said current selected bit among said K input values and otherwise setting said respective output bit to 1;

e) after said step d), revising said numerical bits following said respective current selected bit of said K input values, to the extent necessary as follows, by setting any and all of said numerical bits following said respective current selected bit to be equal to said respective current selected bit respectively in any and all of said input values of which said respective current selected bit does not correspond to said respective output bit;

f) repeating said steps c), d) and e) successively with successive ones of said respective current selected bit with said bit significance thereof successively diminishing in successive cycles of said steps c), d) and e), until all of said output bits of said output value have been or can be determined; and g) outputting said output sign indicator to indicate a sign of said $R^{th}$ greatest value and outputting said output value as a value of said $R^{th}$ greatest value.

2. A method for the digital filtering of K input values by means of a non-linear filter, wherein the filter produces the R-maximum value from the K input values ($K \geq R \geq 1$), and wherein the input values are available in a signed binary number representation in fixed point format, in which the amount of the bit significances descends from a maximum significant bit (MSB) to a less significant bit (LSB) with a factor ½ respectively, only the bit values 0 and 1 occur and if necessary an additional sign bit (SB) exists, in which a) for the single bits starting with the signed bit (SB), if available, or otherwise with the maximum significant bit (MSB) consecutively in terms of a bit significance descending in value as far as to the less significant bit (LSB);

b) for each of the actively examined bits viewed over all K input values;

either the R-maximum bit value is determined, if the significance of the bit actively examined is positive or if the actively examined bit is a signed bit (SB) with value 1 for positive and value 0 for negative numbers, the R-maximum bit value being 1, if for the actively examined bit viewed over all K input values the bit value 1 occurs not less than R-times, otherwise the R-maximum bit value is 0, wherein for number representations with signed bit (SB) the then known sign of the R-maximum value is to be calculated into the significance of the bits succeeding the signed bit (SB), or otherwise the R-minimum bit value is determined, the R-minimum bit value being 1, if for the actively examined bit viewed over all K input values the bit value 0 occurs less than R-times, otherwise the R-minimum bit value is 0, wherein for number representations with signed bit (SB) the then known sign of the R-maximum value is to be calculated into the significance of the bits succeeding the signed bit (SB);

c) the bit value determined this way then being the bit value for the actively examined bit of the R-maximum value and thus of the output value; and d) for those input values, for which the bit value of the actively examined bit does not correspond to the bit value determined this way; for all succeeding bits with regard to the sequence according to a):

the minimum value that can be represented by these bits is used, if with regard to the values presented by the actively examined and the succeeding bits the respective input value does not exceed the R-maximum value; for number representations with signed bit (SB), in case the actively examined bit is not the signed bit (SB), the sign of the R-maximum value is to be calculated into the bit significances for the values presented by the actively examined and the succeeding bits;

the maximum value that can be represented by these bits is used, if with regard to the values presented by the actively examined and the succeeding bits the respective input value does not lie below the R-maximum value; for number representations with signed bit (SB), in case the actively examined bit is not the signed bit (SB), the sign of the R-maximum value is to be calculated into the bit significances for the values presented by the actively examined and succeeding bits.

3. The method for digital filtering according to claim 2, wherein the input values are available in binary representation which has no sign, in which:

a) for the single bits in a descending bit significance starting with the maximum significant bit (MSB) consecutively as far as to the less significant bit (LSB);

b) for the actively examined bit viewed over all K input values the R-maximum bit value is determined, which is 1, if for the actively examined bit viewed over all K input values not less than r-times the bit value 1 occurs, otherwise the R-maximum bit value is 0;

c) the R-maximum bit value then being the bit value for the actively examined bit of the R-maximum value and thus of the output value;

d) and for those input values, for which the bit value of the actively examined bit does not correspond to the R-maximum bit value, the bit value of these input values are used as bit values of all succeeding, i.e. less significant bits for the actively examined bit.

4. The method for digital filtering according to claim 3, wherein as an output value the median of an odd number K of input values is produced in a binary representation which has no sign, for which $R=(K+1)/2$ and in which:

a) for the single bits in a descending bit significance starting with the maximum significant bit (MSB) consecutively as far as to the less significant bit (LSB);

b) it is checked whether for the actively examined bit viewed over all K input value more ones or zeros do occur as bit value;

c) the bit value occurring more frequently representing the bit value of the actively examined bit of the median and thus of the output value;

d) and for those input values, for which the bit value of the actively examined bit does not correspond to the bit value occurring more frequently, the bit value of these input values are used as bit values of all succeeding, i.e. less significant bits for the actively examined bit.

5. The method for digital filtering according to claim 2,wherein the input values are available in one's or two's complement representation, in which:

a) for the single bits in a bit significance descending in value starting with the maximum significant bit (MSB) consecutively as far as to the less significant bit (LSB);

b) for each respective actively examined bit;

in case it is the maximum significant bit (MSB), viewed over all K input values the R-minimum bit is determined, which is 0, if for the actively examined bit viewed over all K input values the bit value 0 occurs not less than R-times otherwise the R-minimum bit value is 1, in case it is not the maximum significant bit (MSB), viewed over all K input values the R-maximum bit is determined, which is 1, if for the actively examined bit viewed over all K input values the bit value 1 occurs not less than R-times otherwise the R-maximum bit value is 0;

c) the bit value determined this way then being the bit value for the actively examined bit of the R-maximum value and thus of the output value; and d) for those input values, for which the bit value of the actively examined bit does not correspond to the bit value determined this way, as bit values of all succeeding bits:

the inverted bit value of these input values is used for the actively examined bit, provided that the actively examined bit is the maximum significant bit (MSB);

the bit value of these input values is used for the actively examined bit, provided that the actively examined bit is not the maximum significant bit (MSB).

6. The method for digital filtering according to claim 5, wherein as an output value the median of an odd number K of input values is produced in binary one's or two's complement representation, for which R=(K+1)/2 and in which:
   a) for the single bits in a bit significance descending in value starting with the maximum significant bit (MSB) consecutively as far as to the less significant bit (LSB);
   b) it is checked whether for the actively examined bit viewed over all K input value more ones or zeros do occur as bit value;
   c) the bit value occurring more frequently then representing the bit value for the actively examined bit of the median and thus of the output value;
   d) and for those input values, for which the bit value of the actively examined bit does not correspond to the bit value occurring more frequently, as bit values of all succeeding bits:
      the inverted bit value of these input values is used for the actively examined bit, provided that the actively examined bit is the maximum significant bit (MSB);
      the bit value of these input values is used for the actively examined bit, provided that the actively examined bit is not the maximum significant bit (MSB).

7. The method for digital filtering according to claim 2, wherein the output values are available in binary sign-value representation, in which:
   a) for the single bits starting with the signed bit (SB) consecutively in terms of a bit significance descending in value as far as to the less significant bit (LSB);
   b) for each respective actively examined bit;
      in case it is the signed bit (SB), viewed over all K input values the R-minimum bit value is determined, which is 0, if for the actively examined bit viewed over all K input values the bit value 0 occurs not less than R-times, otherwise the R-minimum bit value is 1;
      in case it is not the signed bit (SB), viewed over all K input values the R-maximum bit value is determined, which is 1, if for the actively examined bit viewed over all K input values the bit value 1 occurs not less than R-times, otherwise the R-maximum bit value is 0;
   c) the bit value determined this way then being the bit value for the actively examined bit of the R-maximum value and thus of the output value; and
   d) for those input values, for which the bit value of the actively examined bit does not correspond to the bit value determined this way, as bit value for all succeeding bits with regard to the sequence according to a):
      the bit value 0 is used, provided that the actively examined bit is the signed bit (SB);
      the bit value of these input values is used for the actively examined bit, provided that the actively examined bit is not the signed bit (SB).

8. The method for digital filtering according to claim 7, wherein as an output value the median of an odd number K of input values is produced in binary sign-value representation, for which R=(K+1)/2 and in which:
   a) for the single bits starting with the signed bit (SB) consecutively in terms of a bit significance descending in value as far as to the less significant bit (LSB);
   b) it is checked whether for the actively examined bit viewed over all K input value more ones or zeros do occur as bit value;
   c) the bit value occurring more frequently then representing the bit value tor the actively examined bit of the median and thus of the output value;
   d) for those input values, for which the bit value of the actively examined bit does not correspond to bit occurring more frequently, as bit values for all succeeding bits with regard to the sequence according to a):
      the bit value 0 is used, provided that the actively examined bit is the signed bit (SB);
      the bit value of these input values is used for the actively examined bit, provided that the actively examined bit is not the signed bit (SB).

9. The method according to claim 2, wherein for implementing step d) for the input values, for which the bit value of the actively examined bit does not correspond to the bit value of the output value determined in c), all succeeding bits in the memory are substituted accordingly and the subsequent steps b) use the accordingly substituted bit values.

10. The method according to claim 2, wherein a register is provided, in which for each input value it is stored;
   whether for the respective input value already in a bit examined before the bit value of this input value did not correspond to the bit value determined in c) of the output value; and
   if so, which bit value then is to be actively used for this input value in step b).

11. The method according to claim 2, wherein in step b) the number of occurrences of the bit value 1 and 0 respectively for the actively examined bit over the K input values is determined, by a binary adding of the bit values, and in that the addend thus corresponds to the number of occurrence of the value 1 and K respectively minus the addend of the number of occurrence of the value 0.

12. The method according to claim 2, which is interrupted, if there is only one input value in step d), of which the bit values for all bits examined so far inclusive of the actively examined bit did correspond to the bit value of the output value determined in step c), the remaining bits of the output value then corresponding to those of this input value.

13. A digital filter, which successively detects from K adjacent digital values of any long one- or multi-dimensional input signal a digital value of the output signal in accordance with the method of claim 2, the data rate at the input of the filter and the data rate at the output being identical.

14. A digital filter, which successively detects from K adjacent digital values of any long one- or multi-dimensional input signal a digital value of the output signal in accordance with the method of claim 2, the data rate at the input of the filter being larger than the data rate at the output.

15. A digital filter, which successively detects from K adjacent digital values of any long one- or multi-dimensional input signal a digital value of the output signal in accordance with the method of claim 2, the data rate at the input of the filter being larger than the data rate at the output by the factor K, i.e. each value of the input signal is used only one time.

16. A signal processing system with a sampling device for sampling an input signal, an analog-digital converter for digitizing the sampled input signal and a digital filter for carrying out the method according to claim 2.

17. An optical system to detect objects, in which light-induced pulses in the infrared-wave range are radiated, with a signal processing system according to claim 16.

18. A radar system to detect objects with a signal processing system according to claim 16.

19. An ultrasonic wave system to detect objects with a signal processing system according to claim 16.

20. A method of using a signal processing system including a sampling device for sampling an input signal to obtain the input values, an analog-digital converter for digitizing the sampled input signal, and a digital filter for suppressing transient interferences in the input signal, said method comprising carrying out the method according to claim 2 using said digital filter.

21. Use of a method according to claim 2, in order to determine a noise threshold for digital signals in the time domain or frequency domain, which comprise a useful level over the noise level only for single discrete values, via which noise threshold the signal level is interpreted as the useful level and is continuously used.

* * * * *

UNITED STATES PATENT AND TRADEMARK OFFICE
CERTIFICATE OF CORRECTION

PATENT NO. : 7,444,365 B2
APPLICATION NO. : 11/018865
DATED : October 28, 2008
INVENTOR(S) : Wintermantel It is certified that error appears in the above-identified patent and that said Letters Patent is hereby corrected as shown below:

Column 4,
Line 27, after "median of", insert --5--;

Column 5,
Line 15, after "c", insert --or--;
Line 50, after "now" replace "know" with --known--;

Column 6,
Lines 14 to 45, delete these lines of duplicated text;

Column 8,
Line 30, after "with" (first occurrence), replace "v" with --υ--;
Line 47, after "BO", replace "(p)" with --(μ)--;

Column 11,
Line 25, after "domain", insert --,--;

Column 12,
Line 50, after "Doppler frequency", replace "$f_d$" with --$f_D$--;

Column 15,
Line 59, after "values", insert --.--;

Column 17,
Line 35, before "≈ constant", replace "(j2nf)|" with --(j2πf)|--;

Column 18,
Line 9, after "from a", replace "most significant" with --most-significant--;
Line 13, after "numerical" (second occurrence), delete ",";

Column 19,
Line 48, after "way", replace ";" with --,--;

UNITED STATES PATENT AND TRADEMARK OFFICE
CERTIFICATE OF CORRECTION

| | |
|---|---|
| PATENT NO. | : 7,444,365 B2 |
| APPLICATION NO. | : 11/018865 |
| DATED | : October 28, 2008 |
| INVENTOR(S) | : Wintermantel |

It is certified that error appears in the above-identified patent and that said Letters Patent is hereby corrected as shown below:

Column 20,
Lines 50 and 55, after "R-times", insert --,--;

Column 22,
Line 2, after "value" replace "tor" with --for--.

Signed and Sealed this

First Day of December, 2009

David J. Kappos
*Director of the United States Patent and Trademark Office*